United States Patent [19]

Horiguchi et al.

[11] Patent Number: 5,641,718
[45] Date of Patent: Jun. 24, 1997

[54] SINTERED ALUMINUM NITRIDE AND CIRCUIT SUBSTRATE USING SINTERED ALUMINUM NITRIDE

[75] Inventors: Akihiro Horiguchi; Katsuyoshi Oh-Ishi; Mitsuo Kasori; Hiroyasu Sumino, all of Kanagawa-ken; Fumio Ueno, Tokyo; Jun Monma; Kazuo Kimura, both of Kanagawa-ken, all of Japan

[73] Assignee: Kabushiki Kaisha Toshiba, Kawasaki, Japan

[21] Appl. No.: 521,475

[22] Filed: Aug. 30, 1995

[30] Foreign Application Priority Data

Sep. 16, 1994 [JP] Japan .................. 6-221343

[51] Int. Cl.$^6$ .................. C04B 35/58; C04B 35/03; B32B 7/00
[52] U.S. Cl. .................. 501/96.1; 501/123; 501/152; 501/153; 501/154; 428/210; 428/446; 428/688; 428/689; 428/704
[58] Field of Search .................. 428/446, 688, 428/704, 689; 501/96, 97, 123, 152, 153, 154, 98

[56] References Cited

U.S. PATENT DOCUMENTS

| | | | |
|---|---|---|---|
| 3,989,782 | 11/1976 | Lumby et al. | 264/56 |
| 4,407,970 | 10/1983 | Komatsu et al. | 501/97 |
| 4,719,187 | 1/1988 | Bardham et al. | 501/97 |
| 4,883,780 | 11/1989 | Kasori et al. | 501/96 |
| 4,923,829 | 5/1990 | Yasutomi | 501/97 |
| 5,001,089 | 3/1991 | Kasori et al. | 501/96 |
| 5,242,872 | 9/1993 | Taniguchi et al. | 501/96 |
| 5,424,261 | 6/1995 | Harris et al. | 501/96 |

FOREIGN PATENT DOCUMENTS

| | | |
|---|---|---|
| 3 393 524 | 10/1990 | European Pat. Off. . |
| 61-117160 | 6/1986 | Japan . |
| 62-153173 | 7/1987 | Japan . |
| 2-275765 | 11/1990 | Japan . |
| 4-130064 | 5/1992 | Japan . |

*Primary Examiner*—Newton Edwards
*Assistant Examiner*—Cathy F. Lam
*Attorney, Agent, or Firm*—Foley & Lardner

[57] ABSTRACT

Disclosed is a sintered aluminum nitride composition and a circuit substrate for use in semiconductor device. The sintered aluminum nitride composition comprises: aluminum nitride; a first component given by a compound containing an element which is selected from the group consisting of alkaline earth elements and group IIIa elements of the periodic table; a second component made of either a simple silicon or a silicon-containig compound; and a third component made of either a simple manganese or a manganese-containing compound. The circuit substrate has an insulating layer which is compoesd of the above-described sintered aluminum nitride composition, and an electrically conductive layer containing an electrically conductive material and the same components as those of the insulating layer.

26 Claims, 2 Drawing Sheets

SINTERED ALUMINUM NITRIDE AND CIRCUIT SUBSTRATE USING SINTERED ALUMINUM NITRIDE

BACKGROUND OF THE INVENTION

1. Field of the Invention

The present invention relates to a sintered aluminum nitride material and a substrate of microcircuits or integrated circuits which is manufactured by using the sintered aluminum nitride material, particularly to a sintered aluminum nitride material with strength, high density and good heat transfer characteristics which can be manufactured by using low temperature sintering, and a circuit substrate manufactured by using the sintered aluminum nitride material.

2. Description of the Prior Art

Conventionally, circuit substrates with alumina ($Al_2O_3$) as the base material has been used in electronic equipment witch the object of mounting electronic devices such as ICs, LSIs, and the like, fabricating circuits, and insulation. However, since the alumina base material has a low thermal conductivity of about 20 W/m·K which is insufficient for the highly integrated circuit like LSI to radiate heat from the electronic device.

In the above circumstances, a great deal of attention is now being paid to the realization of circuit substrates utilizing a base material formed from an aluminum nitride (AlN) sintered product with a high thermal conductivity which can cope with the densification and high integration of LSIs which has been taking place in recent years.

However, aluminum nitride exhibits strong covalent bonding and is a difficult material to sinter. Therefore, the minimum sintering temperature of 1800° C. is indispensable in obtainig a finely sintered body.

In order to improve this situation, Japanese Laid-Open Patent Application No. 61-117160 discloses a method whereby low temperature sintering is provided using a raw material in which an oxide of rare earth elements and an oxide of alkaline earth elements are added to an aluminum nitride powder. The sintering temperature of this method is 1,700° C. or less. However, this creates a problem inasmuch as there is a tendency toward staining and the like within the sintered body, and thermal conductivity of the sintered material obtained by the above method is quite low. In addition, when the circuit substrate is adopted for a semiconductor element package, there is even the problem that the sealing characteristics deteriorate in the process of glass-sealing a cap onto the base material, the aluminum nitride sintered body, of the circuit substrate.

In addition, Japanese Laid-Open Patent Application No. 62-153173 discloses the provision of high densification and high thermal conductivity in the aluminum nitride sintered body obtained by using a raw material to which at least one type of material selected from elements in group IVa, group Va, group VIa, group VIIa, and group VIII of the periodic table is added to an aluminum nitride powder. However, strength of the sintered body obtained above is insufficient and the surface of the sintered body is rough. In addition, this is also dissatisfactory in glass-sealing characteristics for use as a material of circuit substrate in fabrication of packages.

Moreover, Japanese Laid-Open Patent Application No. 2-275765 discloses a raw material in which an oxide of elements in group IIIa and an element selected from lithium, beryllium, magnesium, boron, silicon, sulfur, phosphorus, arsenic and zinc are added to an aluminum nitride powder. However, the sintered material has a poor strength. Moreover, densification and heat conduction of the sintered material are still insufficient.

Japanese Laid-Open Patent Application No. 4-130064 discloses addition of manganese to the raw aluminum nitride material in order to improve the coloration of the sintered aluminum nitride with large heat conduction. However, there is no prospect of improvement in the strength and the glass sealing characteristics.

SUMMARY OF THE INVENTION

Accordingly, an object of the present invention is, with due consideration to the drawbacks of such conventional materials for a substrate of semiconductor devices, to provide, by low temperature sintering, a sintered aluminum nitride composition which is sufficiently densified, with high thermal conductivity, large strength, good glass-sealing characteristics and smoothness of the surface, such that can be applied to a circuit substrate for semiconductor devices on which high-density, highly integrated electronic and magnetic elements are mounted.

The sintered aluminum nitride composition according to the present invention comprises: aluminum nitride; a first component given by a compound containing an element which is selected from the group consisting of alkaline earth elements and group IIIa elements of the periodic table; a second component made of either a simple silicon or a silicon-containig compound; and a third component made of either a simple manganese or a manganese-containing compound.

Moreover, the sintered aluminum nitride composition according to the present invention comprises: a matrix phase comprising particulate aluminum nitride; and a boundary phase interposing in the matrix phase, the boundary phase comprising: a compound containing an element which is selected from the group consisting of alkaline earth elements and group IIIa elements of the periodic table; a simple silicon or a silicon-containing compound; and a simple manganese or a manganese-containing compound.

Moreover, the circuit substrate according to the present invention comprises: an insulating layer comprising: aluminum nitride; a first component given by a compound containing an element which is selected from the group consisting of alkaline earth elements and group IIIa elements of the periodic table; a second component made of a simple silicon or a silicon-containing compound; and a third component made of a simple manganese or a manganese-containing compound; and an electrically conductive layer comprising: a conductive component given by a metal or an electrically conductive compound for exhibiting electric conductivity; said first component; said second component; and said third component.

According to the above construction, strength of the sintered aluminum nitride material is improved and sufficiently densified, with good glass sealing characteristics.

BRIEF DESCRIPTION OF THE DRAWINGS

These and other objects, features and advantages of the present invention will be more clearly understood from the following description of the preferred embodiments of the present invention taken in conjunction with the accompanying drawings, in which identical reference numerals designate the same or silimar elements or sections throughout the figures thereof and in which.

DETAILED DESCRIPTION OF THE PREFERRED EMBODIMENTS

The present invention will now be explained in detail.

The inventors of the present application have made researches on various additives, in order to accomplish a sintered aluminum nitride (AlN) product manufactured by sintering the raw aluminum nitride material at a low temperature of about 1,600° C., without deterioration of strength of the sintered product and exudation of a sintering assistant to the surface of the sintered product. As a result, they have found that, if a compound which contains at least one element of the group IIIa and/or the alkaline earth group of the periodic table in a form of either an oxide, a carbide, a nitride, a boride or a borate; a simple silicon (Si) or a silicon-containing compound which is in a form of either an oxide, a carbide, a nitride, a boron silicide or a metal silicide; and a simple manganese (Mn) or a manganese-containing compound which is in a form of either an oxide, a carbide, nitride, a boride or a manganate, are added to the raw aluminum nitride to be sintered, the sintered aluminum nitride product has large strength, even when the raw material is sintered at a low temperature.

It has also been found by the inventors that, if the sintered aluminum nitride product containing the additives described above is applied to manufacturing of a circuit substrate which has a ceramic base for insulation and an electrically conductive metallic portion as wires, the ceramic base and the electrically conductive portion of the obtained substrate are tightly bonded to each other. This effect is considered as a result of work of the compound oxide which contains manganese as a main component and which interacts with the metal component of the electrically conductive portion. Moreover, it has been found that resistance of the wires, i.e. the electrically conductive portion, of the obtained substrate is also preferably reduced, accompanying to use of the above-described additives.

The present invention has been accomplished with the above knowledge, and the sintered aluminum nitride material according to the present invention is characterized by comprising a compound which contains at least one element of the group IIIa and/or the alkaline earth group of the periodic table in the form of either an oxide, a carbide, nitride, a boride or a borate; a simple silicon or a silicon-containing compound in a form of either an oxide, a carbide, nitride, a boron silicide or a metal silicide; and a simple manganese or a manganese-containing compound in a form of either an oxide, a carbide, nitride, a boride or a manganate.

Moreover, the circuit substrate according to the present invention is characterized by comprising an insulation layer which is mainly composed of the sintered aluminum nitride material described above and an electrically conductive layer, in which at least a part of the electrically conductive layer comprises a single metal and/or an electrically conductive compound; a compound which contains at least one element of the group IIIa and/or the alkaline earth group of the periodic table; a simple boron or a boron-containing compound in a form of either an oxide, a carbide, nitride, a boron silicide or a metal silicide; and a simple manganese or a manganese-containing compound in a form of either an oxide, a carbide, nitride, a boride or a manganate. The compound of the element of the group IIIa and/or the alkaline earth group of the periodic table is present mainly as a compound which contains aluminum and oxygen and which is represented by the formula: X—Al—O, wherein the component X depicts an alkaline earth element or an element of the group IIIa of the periodic table.

The inventors of the present invention consider, as a result of their researches, that the low sintering temperature and prevention of strength deterioration of the sintered aluminum nitride material are attributable to the structure which will now be described.

It has been conventionally found that sintering of the aluminum nitride is sometimes achieved at a relatively low temperature, and this seems to be possible when the aluminum nitride material contains a some kind of substance like an oxide. By various researches, the inventors has been led into the matter that, during the sintering, the above kind of substance produces a liquid phase among the aluminum nitride particles at a relatively low temperature, and, according as the temperature at which the liquid phase is produced falls, the sintering temperature at which densification of the sintered aluminum nitride is realized falls. In the present invention, it is considered that the compound of the group IIIa element or the alkaline earth element, the manganese component and the silicon component react to produce a composite compound which melts at a low temperature of eutectic point. Accordingly, the aluminum nitride is finely sintered. Moreover, a phase of acicula composite compound containing a large amount of silicon is created, which works like whiskers to impart strength to the sintered material, resulting in prevention of the strength of the sintered material from deterioration.

Now, the desired composition of the sintered aluminum nitride composite according to the present invention will be described below.

The sintered aluminum nitride material contains a compound which contains at least one element which belongs to either the group IIIa or the alkaline earth group of the periodic table, more specifically, at least one element which is selected from the group consisting of scandium (Sc), yttrium (Y), lanthanide elements (La, . . . .), beryllium (Be), magnesium (Mg), calcium (Ca), strontium (Sr), and barium (Ba). The amount of this compound containing the group IIIa element or the alkaline earth group element is preferably settled so that, assuming that the group IIIa element and/or the alkaline earth element of this compound is convered to the corresponding oxide, the amount of that oxide is within a range of 0.01 to 18% by weight relative to the amount of the sintered material. A more desirable amount of the group IIa and/or IIIa element contained is such that corresponds to 0.01 to 10% by weight as the oxide, and the most desirable amount is 0.01 to 5% by weight as the oxide.

The sintered aluminum nitride material contains silicon component, namely, simple silicon or a silicon-containing compound, and examples of silicon-containing compounds include silica ($SiO_2$), silicates ($M_4SiO_4$, $M_2SiO_3$), silicon carbide (SiC), silicon nitride ($Si_3N_4$), boron silicide ($B_4Si$, $SiB_6$), metal silicide ($WSi_2$, $Mo_5Si_3$, $TiSi_2$, $Nb_5Si_3$) and the like. Preferably, the silicon or silicon-containing compound is contained in the sintered material so that the amount of the silicon element is within a range of 0.001 to 10% by weight to the amount of the sintered material. A more desirable amount of the silicon element is 0.01 to 5% by weight, and the most desirable amount is 0.01 to 1% by weight.

In addition, the sintered aluminum nitride material contains manganese component, namely, simple manganese or a manganese-containing compound, and examples of manganese-containing compounds include manganese oxides ($MnO$, $MnO_2$), potassium permanganate, manganese carbide, manganese nitride, manganese boride, manganate and the like. Preferably, the manganese or manganese-containing compound is contained in the sintered material at a content such that the amount of the manganese element is within a range of 0.001 to 10% by weight to the amount of the sintered material. A more desirable amount of the manganese element is 0.01 to 5% by weight, and the most desirable amount is 0.01 to 1% by weight.

If the amounts of the compound containing the group IIIa element or the alkaline earth element, of the silicon or silicon-containing compound, and of the manganese or manganese-containing compound, are less than the preferable ranges, the liquid phase portion does not sufficiently fill the pores between the aluminum nitride particles so that the sintered aluminum nitride material is not dencified. As a result, satisfactory strength and thermal conductivity cannot be achieved. On the other hand, if the amount of the compound containing a group IIIa element or an alkaline earth element exceeds 18% by weight, the liquid phase is excessively produced so that the aluminum nitride particles are not tightly bonded, resulting in reduction of thermal conductivity. If the amounts of the silicon component and the manganese component exceed 10% by weight, respectively, a distinct amount of the silicon element is dissolved into the aluminum nitride, which causes deterioration of thermal conductivity of the sintered material to less than 100 W/m·K.

Below, an example of the manufacturing method for the above-described sintered aluminum nitride material will be described.

First, the compound containing a group IIIa element or an alkaline earth element; the silicon or silicon-containing compound; and the manganese or manganese-containing compound are mixed with the aluminum nitride powder at a specified mixing ratio such that the composition of the mixture conforms the above-described preferable range for each component. The mixture is blended in a ball mill or the like to prepare the raw material.

It is preferable for each of the aluminium nitride powder, the compound of a group IIIa element or an alkaline earth element, the manganese component and the silicon component, to use a powder having an average particle diameter of 10 μm or less, more desirably, of 4 μm or less. If the average primary particle diameter of the aluminum nitride powder exceeds 5 μm, it is difficult to sintered the aluminum nitride sufficiently and finely, and pores remain in the sintered material.

The raw material is mixed with a binder, and, after kneading, granulating, and grading, the body to be sintered is formed. A metal mold press, a cold hydrostatic press, or sheet forming, for example, can be adopted for the forming method. Following the forming of the body, the formed body is heated in an oxygen-free atmosphere, such as in a flow of nitrogen gas, to remove the binder, and then sintered in an atmosphere of a normal, increased or reduced pressure to produce a sintered aluminum nitride body. If a heating temperature such that oxidation of aluminum nitride does not develop is settled, removal of the binder can be carried out in an air. It is preferred to appropriately change the sintering temperature in accordance with the additives to be used, and it is normally settled within a range of 1,400° to 1,800° C. Alternatively, the raw material is directly hot-pressed to produce a sintered aluminum nitride body.

If the green body is formed by pressing the mixture, it is preferred to press It so that the pressed body has a density of 1.50 g/cm$^3$ or more. If the density of the pressed body is less than 1.50 g/cm$^3$, pores are remained in the body after sintering, due to poor packing of the body.

The circuit substrate having an insulation layer and an electrically conductive layer can be manufactured as follows.

First, the raw material containing aluminum nitiride and the additive components as described above, and an organic binder are dispersed in an organic solvent and prepared in slurry form. A green sheet is then prepared from this slurry using a doctor blade.

Next, the single metal substance and/or electrically conducting compound; the AlN powder; at least one compound containing an element selected from the group IIa elements and the group IIIa elements of the periodic table; the silicon or silicon compound; and the manganese or manganese compound, and an organic binder are dispersed in an organic solvent and prepared as a conductive paste.

Examples of the single metal substance and/or electrically conducting compound include tungsten, tungsten boride, tungsten carbide, tungsten silicide, molybdenum, molybdenum boride, molybdenum carbide, molybdenum silicide, and the like. The single metal and the conducting compound are preferably blended so that 75 to 99.5% by weight is contained in the conductive layer formed simultaneously at a later-described sintering step. More preferably, the blended amount of the single metal and the conducting compound is 90 to 99% by weight.

The aluminum nitride powder is preferably blended so that 1 to 10% by weight is contained in the conductive layer formed simultaneously at the later-described sintering process. The AlN powder may also be omitted.

For the compound containing the group IIa and/or IIIa elements of the periodic table, the silicon or silicon-containing compound, and for the manganese or manganese compound in the conductive layer, they can be supplied into the conductive layer by blending a mixed powder which contains aluminum nitride, the compound containing the group IIa and/or IIIa elements of the periodic table, the silicon or silicon-containing compound and the manganese or manganese compound at a mixing ratio such as previously described in the description for the sintered aluminum nitride or the insulating layer, into the conducting compound at a blending ratio of 1 to 25% by weight, preferably 1 to 10% by weight, relative to the total amount of the conducting compound and said mixed powder.

Then, after applying the conductive paste on at least the surface of the green sheet in pattern form using a screen printing method or the like, the circuit substrate is produced by sintering at 1,400° to 1,700° C., and preferably at 1,500° to 1,650° C., in a non-oxidizing atmosphere of nitrogen or the like.

A multilayered circuit substrate is manufactured by the following type of procedure. First, a plurality of via holes is formed at specified positions on the green sheet for joining the layers, and the paste is filled into the via holes when the conductive paste is applied. In this step, pressure may be applied after the paste is filled into the via holes. Similarly, a plurality of the green sheets with the conductive paste filled in the via holes are formed. The green sheets are then built up in layers so that the via holes are in agreement and hot pressed to form a laminated body, after which the ends are cut off to specified dimension. This laminated body is then heated in a non-oxidizing atmosphere of nitrogen or the like, an atmosphere which may contain steam, or an inert atmosphere of argon gas or the like, in order to remove the binder. After the binder has been removed, the multiple layered circuit substrate is produced by sintering at 1,400° to 1,700° C., and preferably at 1,500° to 1,650° C., in a non-oxidizing atmosphere of nitrogen or the like.

Preferred embodiments of the semiconductor element package to which the above-described circuit substrate is used according to the present invention are now described below, with referring to the drawings.

Figure 1:
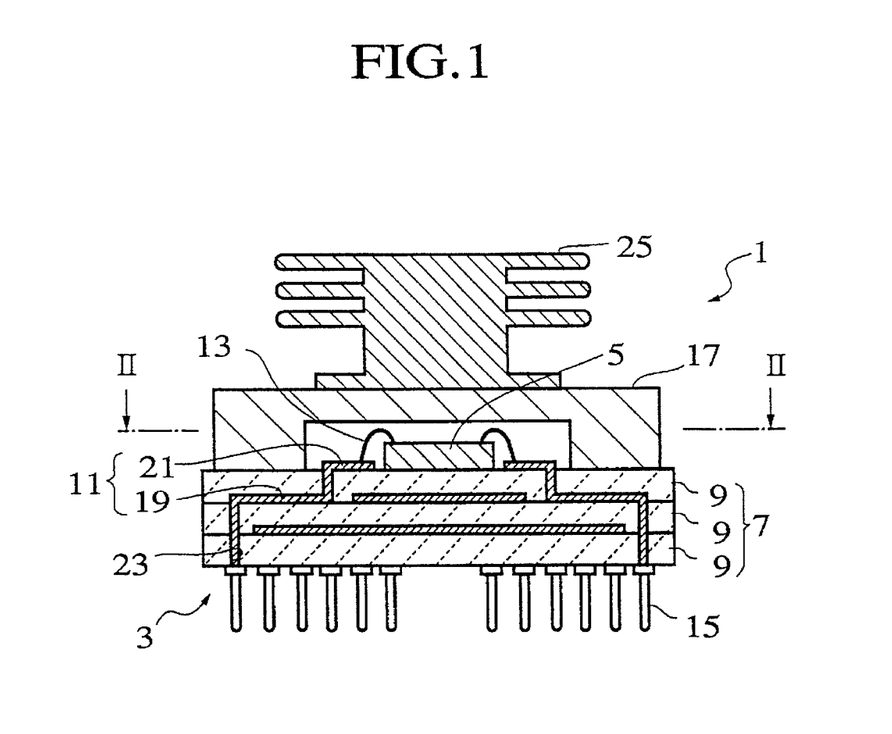
FIG. 1 is a cross-sectional view showing the first embodiment of the semiconductor device according to the present invention.
Figure 2:
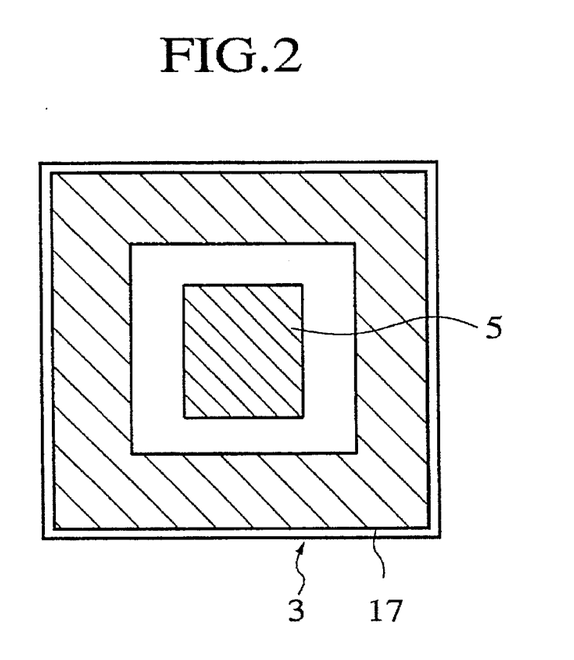
FIG. 2 is a sectional view of the semiconductor device of FIG. 2, taken along a line II—II.

FIGS. 1 and 2 shows the first embodiment of the semiconductor package. In this embodiment, the semiconductor package 1 has a circuit substrate 3 on which a semiconductor element 5 such as an LSI, a power IC and the like is mounted. The circuit substrate 3 comprises a multilayered AlN portion 7 composed of a plurality of insulating layers 9 and a wiring pattern portion constructed as a plurality of wires 11. The wiring pattern portion is bonded to the semiconductor element 5 with bonding wires 13. Moreover, a plurality of lead pins 15 are provided on the circuit substrate 3 at the opposite side to the semiconductor element 5, and they are connected to the wires 11 of the wiring pattern portion with a silver solder or the like, respectively, so that the semiconductor element is electrically connected to the lead pins through the wires 11.

In addition, a cap 17 made of a heat conducting material is mounted on the circuit substrate 3 so as to close the semiconductor element 5 in the cap 17. For the heat conducting material, metals and a specific kind of ceramic materials like aluminum nitride, etc. are generally utilized. The cap 17 is adhered to the circuit substrate 3 with a glass to seal the semiconductor package 1. On the top of the cap 17 attached is a cooling fin 25 which is made of a heat conducting material, e.g. metals, etc., for radiating the heat generated on the semiconductor element 5.

The multilayered AlN portion 7 is formed with the sintered aluminum nitride material described above according to the present invention, and the wiring pattern portion corresponds to the conductive layer of the present invention which is described above. Each wire 11 of the wiring pattern portion has an inner wire 19 which passes through the multilayered AlN portion 7 and an outer wire 21 which is located on the surface of the circuit substrate 3. The inner wire 19 can be produced by making a via hole 23 in the green sheet for the insulating layer 9 and filling the via hole 23 with the conductive paste as previously described, before sintering the multilayered green body. The outer wire 21 can be produced by applying the conductive paste on the green sheet for the insulating layer 9 in pattern form using a screen printing method or the like, before the sintering. Therefore, it will be able to easily understand that the circuit substrate 3 can be manufactured by the same procedure as previously described under the manufacturing of a multilayered circuit substrate.

Figure 3:
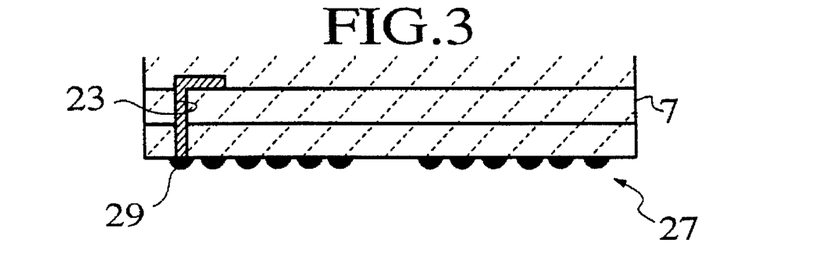
FIG. 3 is a fragmentary sectional view showing a modification of the first embodiment of FIG. 2 according to the present invention.

FIG. 3 shows a modification of the first embodiment. Specifically, a plurality of projections 29 made of a solder are provided on the semiconductor package 27, instead of the lead pins 15, which are connected to the wires 11.

Figure 4:
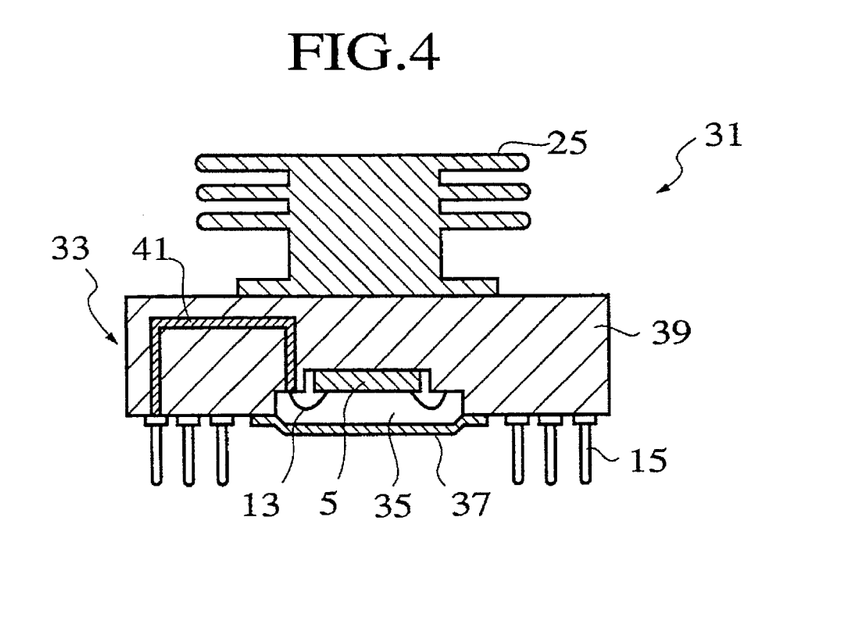
FIG. 4 is a cross-sectional view showing the second embodiment of the semiconductor device according to the present invention.

FIG. 4 shows the second embodiment of the semiconductor package. In this semiconductor package 31, the semiconductor element 5 and the lead pins 15 are arranged at the same side of the circuit substrate 33 so that the semiconductor element 5 is received in a cavity 35 which is formed at the central portion of the mounting surface of the circuit substrate 33. The semiconductor element 5 is closed in the cavity 35 with a metal lid 37 which is adhered to the circuit substrate 33 with a sealing solder. The wiring pattern portion or wires 41, which is made from the conductive paste, connect the lead pins 15 and the semiconductor element 5, passing through the insulating portion 39.

Figure 5:
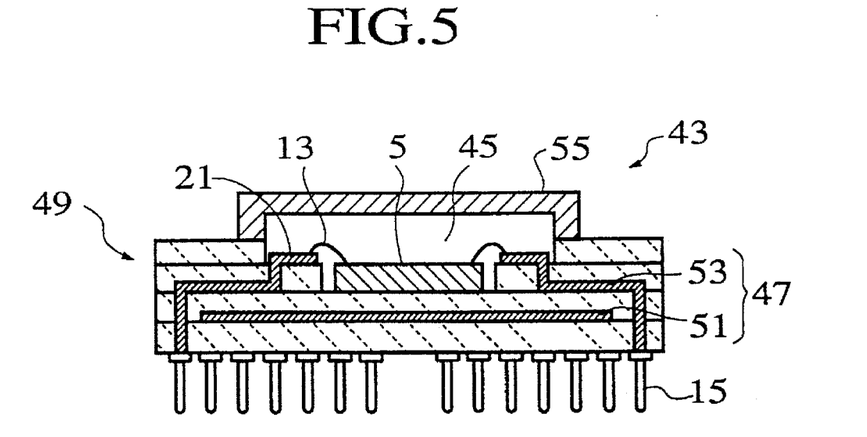
FIG. 5 is a cross-sectional view showing the third embodiment of the semiconductor device according to the present invention.

FIG. 5 shows the third embodiment of the semiconductor package. In this semiconductor package 43, the semiconductor element 5 is received in a cavity 45 which is formed opposite to the lead pins 15. The wiring pattern portion 47 of the circuit substrate 49 has an earth wire 51 for ground connection, as well as the wires 53 for electrically connecting the semiconductor element 5 and the lead pins 15. A metal cap 55 made of coral, 42% nickel alloy or the like is adhered to the circuit substrate 49 with a sealing solder to seal the semiconductor package 43, enclosing the semiconductor element 5.

Other features of this invention will become apparent in the course of the following description of exemplary embodiments which are given for illustration of the invention and are not intended to be limiting thereof.

EXAMPLES

Examples according to the present invention will now be explained in detail based on experimental results.

Example 1

Prepared was a mixture of 94.7% by weight of AlN powder (containing 0.98% by weight of oxygen impurities) of an average primary particle diameter of 0.6 µm; 3.0% by weight of $Y_2O_3$ (purity: 99.9% by weight) of an average particle diameter of 0.1 µm; 1.0% by weight of $CaCO_3$ (purity: 99.9% by weight) of an average particle diameter of 0.5 µm [corresponding to 0.56% by weight as calcium oxide]; 0.5% by weight of $MnO_2$ (purity: 99.9% by weight) of an average particle diameter of 0.2 µm; 0.5 by weight of $SiO_2$ (purity: 99.9% by weight) of an average particle diameter of 0.5 µm; and 0.3% by weight of $WO_3$ (purity: 99.9% by weight) of an average particle diameter of 0.1 µm [corresponding to 0.24% by weight as a simple tungsten] as a colorant.

Then, after breaking up and mixing the mixture with n-butanol in a wet ball mill, the n-butanol was removed, resulting in a raw material powder. Next, 5% by weight of an acrylic binder was added to the raw material which was then granulated. After the granulation, the granulated powder was formed into a compact under a uniaxial pressure of 50 MPa. This compact was heated to 700° C. in an atmosphere of nitrogen gas to remove the acrylic binder. The binder-less compact was set in a sintering setter made of an AlN sintered material and placed in a graphite furnace in an atmosphere of nitrogen gas under a pressure of one arm., then sintered for six hours at 1,600° C.

The resulting AlN sintered concave body was black and exhibited no color irregularities or baking blemishes, and, in addition, had a clean surface. The density was measured at 3.30 gm/cm³, using Archimedes method, and the material was suitably fine. A disk with a diameter of 10 mm and a thickness of 3 mm was cut from the AlN sintered body. The thermal conductivity was measured at a room temperature of 21°±2° C. using a laser flash method conforming to JIS (Japanese Industrial Standard)-R1611, and the result of measurement was 140 W/mK.

In addition, four-point fluexural strength of the obtained sintered body was measured in accordance with the manner of JIS-R1601, and the result of measurement showed large strength of 310 MPa on the average, in spite of the low sintering temeperature.

Comparative Example 1

Prepared was a mixture of 95.2% by weight of AlN powder (containing 0.98% by weight of oxygen impurities) of an average primary particle diameter of 0.6 μm; 3.0% by weight of $Y_2O_3$ (purity: 99.9% by weight) of an average particle diameter of 0.1 μm; 1.0% by weight of CaO; 0.5% by weight of $MnO_2$ (purity: 99.9% by weight) of an average particle diameter of 0.2 μm; and 0.3% by weight of $WO_3$ as a colorant. Then, after breaking up and mixing the mixture with n-butanol in a wet ball mill, the n-butanol was removed, to produce a raw material powder. Next, an AlN sintered body was prepared from this raw material powder using the same process as for the first example.

The density and thermal conductivity of the resulting AlN sintered body were measured in the same manner as for the first example. The results showed a density of 3.30 gm/cm³, and the material was suitably fine. The thermal conductivity was 150 W/m·K. Good surface conditions were also obtained. However, the measurement of four-point flexural strength in the same manner as for the first example indicated deterioration of strength to 180 MPa on the average, which correspondes to about 60% of the value as for the first example, due to low sintering temperature.

Example 2

Prepared was a mixture of 94.7% by weight of AlN powder (containing 1.10% by weight of oxygen impurities) of an average primary particle diameter of 0.7 μm; 3.0% by weight of $Y_2O_3$ (purity: 99.9% by weight) of an average particle diameter of 0.1 μm; 1.0% by weight of $CaCO_3$ (purity: 99.9% by weight) of an average particle diameter of 0.5 μm [corresponding to 0.56% by weight as calcium oxide]; 0.5% by weight of $MnO_2$ (purity: 99.9% by weight) of an average particle diameter of 0.2 μm; 0.5 by weight of $SiO_2$ (purity: 99.9% by weight) of an average particle diameter of 0.5 μm; and 0.3% by weight of $WO_3$ (purity: 99.9% by weight) of an average particle diameter of 0.1 μm [corresponding to 0.24% by weight as a simple tungsten] as a colorant. Then, after breaking up and mixing the mixture with n-butanol in a wet ball mill, the n-butanol was removed, to produce a raw material powder. Next, an AlN sintered body was prepared from this raw material powder using the same process as for the first example, excepting that the sintering was carried out at 1,650° C. for 3 hours.

The density and thermal conductivity of the resulting AlN sintered body were measured in the same manner as for the first example. The results showed a density of 3.29 gm/cm³, and the material was suitably fine. The thermal conductivity was 155 W/m·K.

In addition, four-point fluexural strength of the obtained sintered body was measured in accordance with the manner of JIS-R1601, and the result of measurement showed large strength of 350 MPa on the average, in spite of the low sintering temeperature.

Examples 3 to 124 and Comparative Examples 2 and 3

Using mixed powders composed of the AlN powders and the various additives shown in the following Tables 1-1 to 1-7, AlN sintered bodies were prepared using the same method as for the first example. The results of measurement of the densities, thermal conductivity, surface conditions, surface roughness and four-point flexural strength are also shown in Tables 2-1 to 2-4.

Here, as to judgement of the surface conditions, "A" in the tables indicates that there were no color irregularities or baking blemishes and no deposit were observed visually on the surface, "B" indicates that there was slightly either one of irregularities, baking blemishes or visual observation of deposit, and "C" indicates that there were slightly either two or more of irregularities, baking blemishes or visual observation of deposit. The values of surface roughness in the tables are shown as the average (Ra). The particle dimensions of AlN powders are shown as average primary particle diameters.

Comparative Example 4

Using mixed powders composed of the AlN powders and the various additives shown in the Table 1-7, AlN sintered bodies were prepared using the same method as for the first example, excepting that the sintering temperature was set to 1,800° C. The results of measurement of the densities, thermal conductivity, surface conditions, surface roughness and four-point flexural strength are also shown in Table 2-4.

TABLE 1-1

| | AlN Powder | | | Rare Earth Component (wt %) | | Alkaline Earth Component (wt %) | | Manganese Component (wt %) | | Silicon Component (wt %) | | Other Additives (wt %) | |
|---|---|---|---|---|---|---|---|---|---|---|---|---|---|
| Ex. No. | Amount (wt %) | Particle Diameter (μm) | Oxygen Content (wt %) | | | | | | | | | | |
| 1 | 94.7 | 0.60 | 0.98 | $Y_2O_3$ | 3.0 | $CaCO_3$ | 1.0 | $MnO_2$ | 0.5 | $SiO_2$ | 0.5 | $WO_3$ | 0.3 |
| 2 | 94.7 | 0.70 | 1.10 | $Y_2O_3$ | 3.0 | $CaCO_3$ | 1.0 | $MnO_2$ | 0.5 | $SiO_2$ | 0.5 | $WO_3$ | 0.3 |
| 3 | 94.7 | 0.62 | 0.78 | $YF_3$ | 3.0 | $CaCO_3$ | 1.0 | $MnO_2$ | 0.5 | $Si_3N_4$ | 0.5 | $WO_3$ | 0.3 |
| 4 | 94.7 | 0.60 | 0.98 | $Pr_6O_{11}$ | 3.0 | $CaCO_3$ | 1.0 | $MnO_2$ | 0.5 | $SiO_2$ | 0.5 | $WO_3$ | 0.3 |
| 5 | 94.7 | 0.60 | 0.98 | $Nd_2O_3$ | 3.0 | $CaCO_3$ | 1.0 | $MnO_2$ | 0.5 | $SiO_2$ | 0.5 | $WO_3$ | 0.3 |
| 6 | 94.7 | 0.60 | 0.98 | $Sm_2O_3$ | 3.0 | $CaCO_3$ | 1.0 | $MnO_2$ | 0.5 | $SiO_2$ | 0.5 | $WO_3$ | 0.3 |
| 7 | 94.7 | 0.60 | 0.98 | $Gd_2O_3$ | 3.0 | $CaCO_3$ | 1.0 | $MnO_2$ | 0.5 | $SiO_2$ | 0.5 | $WO_3$ | 0.3 |
| 8 | 86.2 | 0.60 | 0.98 | $Y_2O_3$ | 0.5 | $CaCO_3$ | 12 | $MnO_2$ | 0.5 | $SiO_2$ | 0.5 | $WO_3$ | 0.3 |
| 9 | 86.2 | 0.62 | 0.78 | $YF_3$ | 0.5 | $CaCO_3$ | 12 | $MnO_2$ | 0.5 | $Si_3N_4$ | 0.5 | $WO_3$ | 0.3 |
| 10 | 86.2 | 0.60 | 0.98 | $Pr_6O_{11}$ | 0.5 | $CaCO_3$ | 12 | $mnO_2$ | 0.5 | $SiO_2$ | 0.5 | $WO_3$ | 0.3 |
| 11 | 86.2 | 0.60 | 0.98 | $Nd_2O_3$ | 0.5 | $CaCO_3$ | 12 | $MnO_2$ | 0.5 | $SiO_2$ | 0.5 | $WO_3$ | 0.3 |
| 12 | 86.2 | 0.60 | 0.98 | $Sm_2O_3$ | 0.5 | $CaCO_3$ | 12 | $MnO_2$ | 0.5 | $SiO_2$ | 0.5 | $WO_3$ | 0.3 |
| 13 | 86.2 | 0.60 | 0.98 | $Gd_2O_3$ | 0.5 | $CaCO_3$ | 12 | $MnO_2$ | 0.5 | $SiO_2$ | 0.5 | $WO_3$ | 0.3 |
| 14 | 86.2 | 0.60 | 0.98 | $Y_2O_3$ | 12 | $CaCO_3$ | 0.5 | $MnO_2$ | 0.5 | $SiO_2$ | 0.5 | $WO_3$ | 0.3 |

TABLE 1-1-continued

| Ex. No. | AlN Powder Amount (wt %) | Particle Diameter (μm) | Oxygen Content (wt %) | Rare Earth Component (wt %) | | Alkaline Earth Component (wt %) | | Manganese Component (wt %) | | Silicon Component (wt %) | | Other Additives (wt %) | |
|---|---|---|---|---|---|---|---|---|---|---|---|---|---|
| 15 | 86.2 | 0.62 | 0.78 | $YF_3$ | 12 | $CaCO_3$ | 0.5 | $MnO_2$ | 0.5 | $Si_3N_4$ | 0.5 | $WO_3$ | 0.3 |
| 16 | 86.2 | 0.60 | 0.98 | $Pr_6O_{11}$ | 12 | $CaCO_3$ | 0.5 | $MnO_2$ | 0.5 | $SiO_2$ | 0.5 | $WO_3$ | 0.3 |
| 17 | 86.2 | 0.60 | 0.98 | $Nd_2O_3$ | 12 | $CaCO_3$ | 0.5 | $MnO_2$ | 0.5 | $SiO_2$ | 0.5 | $WO_3$ | 0.3 |
| 18 | 86.2 | 0.60 | 0.98 | $Sm_2O_3$ | 12 | $CaCO_3$ | 0.5 | $MnO_2$ | 0.5 | $SiO_2$ | 0.5 | $WO_3$ | 0.3 |
| 19 | 86.2 | 0.60 | 0.98 | $Gd_2O_3$ | 12 | $CaCO_3$ | 0.5 | $MnO_2$ | 0.5 | $SiO_2$ | 0.5 | $WO_3$ | 0.3 |
| 20 | 91.7 | 0.60 | 0.98 | $Y_2O_3$ | 6.0 | $CaCO_3$ | 1.0 | $MnO_2$ | 0.5 | $Si_3N_4$ | 0.5 | $WO_3$ | 0.3 |

TABLE 1-2

| Ex. No. | AlN Powder Amount (wt %) | Particle Diameter (μm) | Oxygen Content (wt %) | Rare Earth Component (wt %) | | Alkaline Earth Component (wt %) | | Manganese Component (wt %) | | Silicon Component (wt %) | | Other Additives (wt %) | |
|---|---|---|---|---|---|---|---|---|---|---|---|---|---|
| 21 | 91.7 | 0.60 | 0.98 | $Pr_6O_{11}$ | 6.0 | $CaCO_3$ | 1.0 | $MnO_2$ | 0.5 | $SiO_2$ | 0.5 | $WO_3$ | 0.3 |
| 22 | 91.7 | 0.60 | 0.98 | $Nd_2O_3$ | 6.0 | $CaCO_3$ | 1.0 | $MnO_2$ | 0.5 | $SiO_2$ | 0.5 | $WO_3$ | 0.3 |
| 23 | 91.7 | 0.60 | 0.98 | $Sm_2O_3$ | 6.0 | $CaCO_3$ | 1.0 | $MnO_2$ | 0.5 | $SiO_2$ | 0.5 | $WO_3$ | 0.3 |
| 24 | 91.7 | 0.60 | 0.98 | $Gd_2O_3$ | 6.0 | $CaCO_3$ | 1.0 | $MnO_2$ | 0.5 | $SiO_2$ | 0.5 | $WO_3$ | 0.3 |
| 25 | 91.7 | 0.60 | 0.98 | $Y_2O_3$ | 1.0 | $CaCO_3$ | 6.0 | $MnO_2$ | 0.5 | $SiO_2$ | 0.5 | $WO_3$ | 0.3 |
| 26 | 91.7 | 0.62 | 0.78 | $YF_3$ | 1.0 | $CaCO_3$ | 6.0 | $MnO_2$ | 0.5 | $Si_3N_4$ | 0.5 | $WO_3$ | 0.3 |
| 27 | 91.7 | 0.60 | 0.98 | $Pr_6O_{11}$ | 1.0 | $CaCO_3$ | 6.0 | $MnO_2$ | 0.5 | $SiO_2$ | 0.5 | $WO_3$ | 0.3 |
| 28 | 91.7 | 0.60 | 0.98 | $Nd_2O_3$ | 1.0 | $CaCO_3$ | 6.0 | $MnO_2$ | 0.5 | $SiO_2$ | 0.5 | $WO_3$ | 0.3 |
| 29 | 91.7 | 0.60 | 0.98 | $Sm_2O_3$ | 1.0 | $CaCO_3$ | 6.0 | $MnO_2$ | 0.5 | $SiO_2$ | 0.5 | $WO_3$ | 0.3 |
| 30 | 91.7 | 0.60 | 0.98 | $Gd_2O_3$ | 1.0 | $CaCO_3$ | 6.0 | $MnO_2$ | 0.5 | $SiO_2$ | 0.5 | $WO_3$ | 0.3 |
| 31 | 94.7 | 0.60 | 0.98 | $Y_2O_3$ | 3.0 | $CaCO_3$ | 1.0 | $MnO_2$ | 0.1 | $SiO_2$ | 0.9 | $WO_3$ | 0.3 |
| 32 | 94.7 | 0.62 | 0.78 | $YF_3$ | 3.0 | $CaCO_3$ | 1.0 | $MnO_2$ | 0.1 | $Si_3N_4$ | 0.9 | $WO_3$ | 0.3 |
| 33 | 94.7 | 0.60 | 0.98 | $Pr_6O_{11}$ | 3.0 | $CaCO_3$ | 1.0 | $MnO_2$ | 0.1 | $SiO_2$ | 0.9 | $WO_3$ | 0.3 |
| 34 | 94.7 | 0.60 | 0.98 | $Nd_2O_3$ | 3.0 | $CaCO_3$ | 1.0 | $MnO_2$ | 0.1 | $SiO_2$ | 0.9 | $WO_3$ | 0.3 |
| 35 | 94.7 | 0.60 | 0.98 | $Sm_2O_3$ | 3.0 | $CaCO_3$ | 1.0 | $MnO_2$ | 0.1 | $SiO_2$ | 0.9 | $WO_3$ | 0.3 |
| 36 | 94.7 | 0.60 | 0.98 | $Gd_2O_3$ | 3.0 | $CaCO_3$ | 1.0 | $MnO_2$ | 0.1 | $SiO_2$ | 0.9 | $WO_3$ | 0.3 |
| 37 | 94.7 | 0.60 | 0.98 | $Y_2O_3$ | 3.0 | $CaCO_3$ | 1.0 | $MnO_2$ | 0.1 | $SiO_2$ | 0.9 | $WO_3$ | 0.3 |
| 38 | 94.7 | 0.62 | 0.78 | $YF_3$ | 3.0 | $CaCO_3$ | 1.0 | $MnO_2$ | 0.1 | $Si_3N_4$ | 0.9 | $WO_3$ | 0.3 |
| 39 | 94.7 | 0.60 | 0.98 | $Pr_6O_{11}$ | 3.0 | $CaCO_3$ | 1.0 | $MnO_2$ | 0.1 | $SiO_2$ | 0.9 | $WO_3$ | 0.3 |
| 40 | 94.7 | 0.60 | 0.98 | $Nd_2O_3$ | 3.0 | $CaCO_3$ | 1.0 | $MnO_2$ | 0.1 | $SiO_2$ | 0.9 | $WO_3$ | 0.3 |

TABLE 1-3

| Ex. No. | AlN Powder Amnt. (wt %) | Particle Diam. (μm) | Oxy. Cont. (wt %) | Rare Earth Component (wt %) | | Alkaline Earth Component (wt %) | | Manganese Component (wt %) | |
|---|---|---|---|---|---|---|---|---|---|
| 41 | 94.7 | 0.60 | 0.98 | $Sm_2O_3$ | 3.0 | $CaCO_3$ | 1.0 | $MnO_2$ | 0.9 |
| 42 | 94.7 | 0.60 | 0.98 | $Gd_2O_3$ | 3.0 | $CaCO_3$ | 1.0 | $MnO_2$ | 0.9 |
| 43 | 94.7 | 0.60 | 0.98 | $Y_2O_3$ | 3.0 | $CaCO_3$ | 1.0 | $MnO_2$ | 0.9 |
| 44 | 94.7 | 0.62 | 0.78 | $YF_3$ | 3.0 | $CaCO_3$ | 1.0 | $MnO_2$ | 0.5 |
| 45 | 94.7 | 0.60 | 0.98 | $Pr_6O_{11}$ | 3.0 | $CaCO_3$ | 1.0 | $MnO_2$ | 0.5 |
| 46 | 94.7 | 0.60 | 0.98 | $Nd_2O_3$ | 3.0 | $CaCO_3$ | 1.0 | $MnO_2$ | 0.5 |
| 47 | 94.7 | 0.60 | 0.98 | $Sm_2O_3$ | 3.0 | $CaCO_3$ | 1.0 | $MnO_2$ | 0.5 |
| 48 | 94.7 | 0.60 | 0.98 | $Gd_2O_3$ | 3.0 | $CaCO_3$ | 1.0 | $MnO_2$ | 0.5 |
| 49 | 93.7 | 0.60 | 0.98 | $Y_2O_3$ | 3.0 | $CaCO_3$ | 1.0 | $MnO_2$ | 0.5 |
| 50 | 93.7 | 0.62 | 0.78 | $YF_3$ | 3.0 | $CaCO_3$ | 1.0 | $MnO_2$ | 0.5 |
| 51 | 93.3 | 0.60 | 0.98 | $Pr_6O_{11}$ | 3.0 | $CaCO_3$ | 1.0 | $MnO_2$ | 0.9 |
| 52 | 93.3 | 0.60 | 0.98 | $Nd_2O_3$ | 3.0 | $CaCO_3$ | 1.0 | $MnO_2$ | 0.9 |
| 53 | 93.3 | 0.60 | 0.98 | $Sm_2O_3$ | 3.0 | $CaCO_3$ | 1.0 | $MnO_2$ | 0.9 |
| 54 | 93.3 | 0.60 | 0.98 | $Gd_2O_3$ | 0.5 | $CaCO_3$ | 1.0 | $MnO_2$ | 0.9 |
| 55 | 84.8 | 0.60 | 0.98 | $Y_2O_3$ | 0.5 | $CaCO_3$ | 12.0 | $MnO_2$ | 0.9 |
| 56 | 85.4 | 0.62 | 0.78 | $YF_3$ | 0.5 | $CaCO_3$ | 12.0 | $MnO_2$ | 0.9 |
| 57 | 85.4 | 0.60 | 0.98 | $Pr6_{O11}$ | 0.5 | $CaCO_3$ | 12.0 | $MnO_2$ | 0.9 |
| 58 | 85.4 | 0.60 | 0.98 | $Nd_2O_3$ | 0.5 | $CaCO_3$ | 12.0 | $MnO_2$ | 0.9 |
| 59 | 85.4 | 0.60 | 0.98 | $Sm_2O_3$ | 0.5 | $CaCO_3$ | 12.0 | $MnO_2$ | 0.9 |
| 60 | 85.4 | 0.60 | 0.98 | $Gd_2O_3$ | 0.5 | $CaCO_3$ | 12.0 | $MnO_2$ | 0.9 |

TABLE 1-3-continued

| Ex. No. | Silicon Component (wt %) | | | | Other Additives (wt %) | | | |
|---|---|---|---|---|---|---|---|---|
| 41 | SiO$_2$ | 0.1 | WO$_3$ | 0.3 | | | | |
| 42 | SiO$_2$ | 0.1 | WO$_3$ | 0.3 | | | | |
| 43 | SiO$_2$ | 0.1 | WO$_3$ | 0.3 | | | | |
| 44 | Si$_3$N$_4$ | 0.5 | WO$_3$ | 0.3 | | | | |
| 45 | SiO$_2$ | 0.5 | WO$_3$ | 0.3 | | | | |
| 46 | SiO$_2$ | 0.5 | WO$_3$ | 0.3 | | | | |
| 47 | SiO$_2$ | 0.5 | WO$_3$ | 0.3 | | | | |
| 48 | SiO$_2$ | 0.5 | WO$_3$ | 0.3 | | | | |
| 49 | SiO$_2$ | 0.5 | WO$_3$ | 0.3, | WB | 0.5, | Al$_2$O$_3$ | 0.5 |
| 50 | Si$_3$N$_4$ | 0.5 | WO$_3$ | 0.3, | TiB$_2$ | 0.5, | Al$_2$O$_3$ | 0.5 |
| 51 | SiO$_2$ | 0.5 | WO$_3$ | 0.3, | LaB$_6$ | 0.5, | Al$_2$O$_3$ | 0.5 |
| 52 | SiO$_2$ | 0.5 | WO$_3$ | 0.3, | B$_2$O$_3$ | 0.5, | Al$_2$O$_3$ | 0.5 |
| 53 | SiO$_2$ | 0.5 | WO$_3$ | 0.3, | B$_2$O$_3$ | 0.5, | Al$_2$O$_3$ | 0.5 |
| 54 | SiO$_2$ | 0.5 | WO$_3$ | 0.3, | B$_2$O$_3$ | 0.5, | Al$_2$O$_3$ | 0.5 |
| 55 | SiO$_2$ | 0.5 | WO$_3$ | 0.3, | B$_2$O$_3$ | 0.5, | Al$_2$O$_3$ | 0.5 |
| 56 | Si$_3$N$_4$ | 0.5 | WO$_3$ | 0.3, | B$_2$O$_3$ | 0.2, | Al$_2$O$_3$ | 0.2 |
| 57 | SiO$_2$ | 0.5 | WO$_3$ | 0.3, | B$_2$O$_3$ | 0.2, | Al$_2$O$_3$ | 0.2 |
| 58 | SiO$_2$ | 0.5 | WO$_3$ | 0.3, | B$_2$O$_3$ | 0.2, | Al$_2$O$_3$ | 0.2 |
| 59 | SiO$_2$ | 0.5 | WO$_3$ | 0.3, | B$_2$O$_3$ | 0.2, | Al$_2$O$_3$ | 0.2 |
| 60 | SiO$_2$ | 0.5 | WO$_3$ | 0.3, | B$_2$O$_3$ | 0.2, | Al$_2$O$_3$ | 0.2 |

TABLE 1-4

| Ex. No. | AlN Powder | | | Rare Earth Component (wt %) | | Alkaline Earth Component (wt %) | | Manganese Component (wt %) | |
|---|---|---|---|---|---|---|---|---|---|
| | Amnt. (wt %) | Particle Diam. (μm) | Oxy. Cont. (wt %) | | | | | | |
| 61 | 85.8 | 0.60 | 0.98 | Y$_2$O$_3$ | 12.0 | CaCO$_3$ | 0.5 | MnO$_2$ | 0.5 |
| 62 | 85.8 | 0.62 | 0.78 | YF$_3$ | 12.0 | CaCO$_3$ | 0.5 | MnO$_2$ | 0.5 |
| 63 | 85.8 | 0.60 | 0.98 | Pr$_6$O$_{11}$ | 12.0 | CaCO$_3$ | 0.5 | MnO$_2$ | 0.5 |
| 64 | 85.8 | 0.60 | 0.98 | Nd$_2$O$_3$ | 12.0 | CaCO$_3$ | 0.5 | MnO$_2$ | 0.5 |
| 65 | 85.8 | 0.60 | 0.98 | Sm$_2$O$_3$ | 12.0 | CaCO$_3$ | 0.5 | MnO$_2$ | 0.5 |
| 66 | 85.8 | 0.60 | 0.98 | Gd$_2$O$_3$ | 12.0 | CaCO$_3$ | 0.5 | MnO$_2$ | 0.5 |
| 67 | 91.3 | 0.60 | 0.98 | Y$_2$O$_3$ | 6.0 | CaCO$_3$ | 1.0 | MnO$_2$ | 0.5 |
| 68 | 91.3 | 0.62 | 0.78 | YF$_3$ | 6.0 | CaCO$_3$ | 1.0 | MnO$_2$ | 0.5 |
| 69 | 91.3 | 0.60 | 0.98 | Pr$_6$O$_{11}$ | 6.0 | CaCO$_3$ | 1.0 | MnO$_2$ | 0.5 |
| 70 | 91.3 | 0.60 | 0.98 | Nd$_2$O$_3$ | 6.0 | CaCO$_3$ | 1.0 | MnO$_2$ | 0.5 |
| 71 | 91.3 | 0.60 | 0.98 | Sm$_2$O$_3$ | 6.0 | CaCO$_3$ | 1.0 | MnO$_2$ | 0.5 |
| 72 | 91.3 | 0.60 | 0.98 | Gd$_2$O$_3$ | 6.0 | CaCO$_3$ | 1.0 | MnO$_2$ | 0.5 |
| 73 | 91.3 | 0.60 | 0.98 | Y$_2$O$_3$ | 1.0 | CaCO$_3$ | 6.0 | MnO$_2$ | 0.5 |
| 74 | 91.3 | 0.62 | 0.78 | YF$_3$ | 1.0 | CaCO$_3$ | 6.0 | MnO$_2$ | 0.5 |
| 75 | 91.3 | 0.60 | 0.98 | Pr$_6$O$_{11}$ | 1.0 | CaCO$_3$ | 6.0 | MnO$_2$ | 0.5 |
| 76 | 91.3 | 0.60 | 0.98 | Nd$_2$O$_3$ | 1.0 | CaCO$_3$ | 6.0 | MnO$_2$ | 0.5 |
| 77 | 91.3 | 0.60 | 0.98 | Sm$_2$O$_3$ | 1.0 | CaCO$_3$ | 6.0 | MnO$_2$ | 0.5 |
| 78 | 91.3 | 0.60 | 0.98 | Gd$_2$O$_3$ | 1.0 | CaCO$_3$ | 6.0 | MnO$_2$ | 0.5 |
| 79 | 86.2 | 0.60 | 0.98 | Y$_2$O$_3$ | 3.0 | CaCO$_3$ | 1.0 | MnO$_2$ | 0.1 |
| 80 | 86.2 | 0.62 | 0.78 | YF$_3$ | 3.0 | CaCO$_3$ | 1.0 | MnO$_2$ | 0.1 |

| Ex. No. | Silicon Component (wt %) | | | | Other Additives (wt %) | | | |
|---|---|---|---|---|---|---|---|---|
| 61 | SiO$_2$ | 0.5 | WO$_3$ | 0.3, | B$_2$O$_3$ | 0.2, | Al$_2$O$_3$ | 0.2 |
| 62 | Si$_3$N$_4$ | 0.5 | WO$_3$ | 0.3, | B$_2$O$_3$ | 0.2, | Al$_2$O$_3$ | 0.2 |
| 63 | SiO$_2$ | 0.5 | WO$_3$ | 0.3, | B$_2$O$_3$ | 0.2, | Al$_2$O$_3$ | 0.2 |
| 64 | SiO$_2$ | 0.5 | WO$_3$ | 0.3, | B$_2$O$_3$ | 0.2, | Al$_2$O$_3$ | 0.2 |
| 65 | SiO$_2$ | 0.5 | WO$_3$ | 0.3, | B$_2$O$_3$ | 0.2, | Al$_2$O$_3$ | 0.2 |
| 66 | SiO$_2$ | 0.5 | WO$_3$ | 0.3, | B$_2$O$_3$ | 0.2, | Al$_2$O$_3$ | 0.2 |
| 67 | SiO$_2$ | 0.5 | WO$_3$ | 0.3, | B$_2$O$_3$ | 0.2, | Al$_2$O$_3$ | 0.2 |
| 68 | Si$_3$N$_4$ | 0.5 | WO$_3$ | 0.3, | B$_2$O$_3$ | 0.2, | Al$_2$O$_3$ | 0.2 |
| 69 | SiO$_2$ | 0.5 | WO$_3$ | 0.3, | B$_2$O$_3$ | 0.2, | Al$_2$O$_3$ | 0.2 |
| 70 | SiO$_2$ | 0.5 | WO$_3$ | 0.3, | B$_2$O$_3$ | 0.2, | Al$_2$O$_3$ | 0.2 |
| 71 | SiO$_2$ | 0.5 | WO$_3$ | 0.3, | B$_2$O$_3$ | 0.2, | Al$_2$O$_3$ | 0.2 |
| 72 | SiO$_2$ | 0.5 | WO$_3$ | 0.3, | B$_2$O$_3$ | 0.2, | Al$_2$O$_3$ | 0.2 |
| 73 | SiO$_2$ | 0.5 | WO$_3$ | 0.3, | B$_2$O$_3$ | 0.2, | Al$_2$O$_3$ | 0.2 |
| 74 | Si$_3$N$_4$ | 0.5 | WO$_3$ | 0.3, | B$_2$O$_3$ | 0.2, | Al$_2$O$_3$ | 0.2 |
| 75 | SiO$_2$ | 0.5 | WO$_3$ | 0.3, | B$_2$O$_3$ | 0.2, | Al$_2$O$_3$ | 0.2 |
| 76 | SiO$_2$ | 0.5 | WO$_3$ | 0.3, | B$_2$O$_3$ | 0.2, | Al$_2$O$_3$ | 0.2 |
| 77 | SiO$_2$ | 0.5 | WO$_3$ | 0.3, | B$_2$O$_3$ | 0.2, | Al$_2$O$_3$ | 0.2 |
| 78 | SiO$_2$ | 0.5 | WO$_3$ | 0.3, | B$_2$O$_3$ | 0.2, | Al$_2$O$_3$ | 0.2 |

TABLE 1-4-continued

| | | | | | | | | |
|---|---|---|---|---|---|---|---|---|
| 79 | SiO$_2$ | 9.0 | WO$_3$ | 0.3, | B$_2$O$_3$ | 0.2, | Al$_2$O$_3$ | 0.2 |
| 80 | Si$_3$N$_4$ | 9.0 | WO$_3$ | 0.3, | B$_2$O$_3$ | 0.2, | Al$_2$O$_3$ | 0.2 |

TABLE 1-5

| | AlN Powder | | | Rare | | Alkaline | | | |
|---|---|---|---|---|---|---|---|---|---|
| Ex. No. | Amnt. (wt %) | Particle Diam. (μm) | Oxy. Cont. (wt %) | Earth Component (wt %) | | Earth Component (wt %) | | Manganese Component (wt %) | |
| 81 | 86.2 | 0.60 | 0.98 | Pr$_6$O$_{11}$ | 3.0 | CaCO$_3$ | 1.0 | MnO$_2$ | 0.1 |
| 82 | 86.2 | 0.60 | 0.98 | Nd$_2$O$_3$ | 3.0 | BaCO$_3$ | 1.0 | MnO$_2$ | 0.1 |
| 83 | 86.2 | 0.60 | 0.98 | Sm$_2$O$_3$ | 3.0 | SrCO$_3$ | 1.0 | MnO$_2$ | 0.1 |
| 84 | 86.2 | 0.60 | 0.98 | Gd$_2$O$_3$ | 3.0 | CaCO$_3$ | 1.0 | MnO$_2$ | 0.1 |
| 85 | 86.2 | 0.60 | 0.98 | Y$_2$O$_3$ | 3.0 | CaCO$_3$ | 1.0 | MnO$_2$ | 9.0 |
| 86 | 86.2 | 0.62 | 0.78 | YF$_3$ | 3.0 | SrCO$_3$ | 1.0 | MnO$_2$ | 9.0 |
| 87 | 86.2 | 0.60 | 0.98 | Pr$_6$O$_{11}$ | 3.0 | CaCO$_3$ | 1.0 | MnO$_2$ | 9.0 |
| 88 | 86.2 | 0.60 | 0.98 | Nd$_2$O$_3$ | 3.0 | CaCO$_3$ | 1.0 | MnO$_2$ | 9.0 |
| 89 | 86.2 | 0.60 | 0.98 | Sm$_2$O$_3$ | 3.0 | CaCO$_3$ | 1.0 | MnO$_2$ | 9.0 |
| 90 | 86.2 | 0.60 | 0.98 | Gd$_2$O$_3$ | 3.0 | BaCO$_3$ | 1.0 | MnO$_2$ | 9.0 |
| 91 | 85.3 | 0.60 | 0.98 | Y$_2$O$_3$ | 3.0 | CaCO$_3$ | 1.0 | MnO$_2$ | 5.0 |
| 92 | 87.3 | 0.62 | 0.78 | YF$_3$ | 1.0 | CaCO$_3$ | 1.0 | MnO$_2$ | 5.0 |
| 93 | 85.3 | 0.60 | 0.98 | Pr$_6$O$_{11}$ | 3.0 | CaCO$_3$ | 1.0 | MnO$_2$ | 5.0 |
| 94 | 85.3 | 0.60 | 0.98 | Nd$_2$O$_3$ | 3.0 | BaCO$_3$ | 1.0 | MnO$_2$ | 5.0 |
| 95 | 85.3 | 0.60 | 0.98 | Sm$_2$O$_3$ | 3.0 | SrCO$_3$ | 1.0 | MnO$_2$ | 5.0 |
| 96 | 85.3 | 0.60 | 0.98 | Gd$_2$O$_3$ | 3.0 | CaCO$_3$ | 1.0 | MnO$_2$ | 5.0 |
| 97 | 96.7 | 0.60 | 0.98 | — | | CaCO$_3$ | 2.0 | MnO$_2$ | 0.5 |
| 98 | 92.7 | 0.62 | 0.78 | — | | CaCO$_3$ | 6.0 | MnO$_2$ | 0.5 |
| 99 | 86.7 | 0.60 | 0.98 | — | | CaCO$_3$ | 12.0 | MnO$_2$ | 0.5 |
| 100 | 96.3 | 0.60 | 0.98 | — | | CaCO$_3$ | 2.0 | MnO$_2$ | 0.5 |

| Ex. No. | Silicon Component (wt %) | | Other Additives (wt %) | | | | | |
|---|---|---|---|---|---|---|---|---|
| 81 | SiO$_2$ | 9.0 | WO$_3$ | 0.3, | B$_2$O$_3$ | 0.2, | Al$_2$O$_3$ | 0.2 |
| 82 | SiO$_2$ | 9.0 | WO$_3$ | 0.3, | B$_2$O$_3$ | 0.2, | Al$_2$O$_3$ | 0.2 |
| 83 | SiO$_2$ | 9.0 | WO$_3$ | 0.3, | B$_2$O$_3$ | 0.2, | Al$_2$O$_3$ | 0.2 |
| 84 | SiO$_2$ | 9.0 | WO$_3$ | 0.3, | B$_2$O$_3$ | 0.2, | Al$_2$O$_3$ | 0.2 |
| 85 | SiO$_2$ | 0.1 | WO$_3$ | 0.3, | B$_2$O$_3$ | 0.2, | Al$_2$O$_3$ | 0.2 |
| 86 | Si$_3$N$_4$ | 0.1 | WO$_3$ | 0.3, | B$_2$O$_3$ | 0.2, | Al$_2$O$_3$ | 0.2 |
| 87 | SiO$_2$ | 0.1 | WO$_3$ | 0.3, | B$_2$O$_3$ | 0.2, | Al$_2$O$_3$ | 0.2 |
| 88 | SiO$_2$ | 0.1 | WO$_3$ | 0.3, | B$_2$O$_3$ | 0.2, | Al$_2$O$_3$ | 0.2 |
| 89 | SiO$_2$ | 0.1 | WO$_3$ | 0.3, | B$_2$O$_3$ | 0.2, | Al$_2$O$_3$ | 0.2 |
| 90 | SiO$_2$ | 0.1 | WO$_3$ | 0.3, | B$_2$O$_3$ | 0.2, | Al$_2$O$_3$ | 0.2 |
| 91 | SiO$_2$ | 5.0 | WO$_3$ | 0.3, | B$_2$O$_3$ | 0.2, | Al$_2$O$_3$ | 0.2 |
| 92 | Si$_3$N$_4$ | 5.0 | WO$_3$ | 0.3, | B$_2$O$_3$ | 0.2, | Al$_2$O$_3$ | 0.2 |
| 93 | SiO$_2$ | 5.0 | WO$_3$ | 0.3, | B$_2$O$_3$ | 0.2, | Al$_2$O$_3$ | 0.2 |
| 94 | SiO$_2$ | 5.0 | WO$_3$ | 0.3, | B$_2$O$_3$ | 0.2, | Al$_2$O$_3$ | 0.2 |
| 95 | SiO$_2$ | 5.0 | WO$_3$ | 0.3, | B$_2$O$_3$ | 0.2, | Al$_2$O$_3$ | 0.2 |
| 96 | SiO$_2$ | 5.0 | WO$_3$ | 0.3, | B$_2$O$_3$ | 0.2, | Al$_2$O$_3$ | 0.2 |
| 97 | SiO$_2$ | 0.5 | WO$_3$ | 0.3 | | | | |
| 98 | SiO$_2$ | 0.5 | WO$_3$ | 0.3 | | | | |
| 99 | SiO$_2$ | 0.5 | WO$_3$ | 0.3 | | | | |
| 100 | SiO$_2$ | 0.5 | WO$_3$ | 0.3, | B$_2$O$_3$ | 0.2, | Al$_2$O$_3$ | 0.2 |

TABLE 1-6

| | AlN Powder | | | Rare | | Alkali | | | |
|---|---|---|---|---|---|---|---|---|---|
| Ex. No. | Amnt. (wt %) | Particle Diam. (μm) | Oxy. Cont. (wt %) | Earth Component (wt %) | | Earth Component (wt %) | | Manganese Component (wt %) | |
| 101 | 92.3 | 0.60 | 0.98 | — | | CaCO$_3$ | 6.0 | MnO$_2$ | 0.5 |
| 102 | 86.3 | 0.60 | 0.98 | — | | CaCO$_3$ | 12.0 | MnO$_2$ | 0.5 |
| 103 | 96.7 | 0.60 | 0.98 | Y$_2$O$_3$ | 2.0 | — | | MnO$_2$ | 0.5 |
| 104 | 92.7 | 0.62 | 0.78 | YF$_3$ | 6.0 | — | | MnO$_2$ | 0.5 |
| 105 | 86.7 | 0.60 | 0.98 | Pr$_6$O$_{11}$ | 12.0 | — | | MnO$_2$ | 0.5 |
| 106 | 96.3 | 0.60 | 0.98 | Nd$_2$O$_3$ | 2.0 | — | | MnO$_2$ | 0.5 |
| 107 | 92.3 | 0.60 | 0.98 | Sm$_2$O$_3$ | 6.0 | — | | MnO$_2$ | 0.5 |
| 108 | 86.0 | 0.60 | 0.98 | Gd$_2$O$_3$ | 12.0 | — | | MnO$_2$ | 0.5 |
| 109 | 94.2 | 0.60 | 0.98 | Y$_2$O$_3$ | 3.0 | CaCO$_3$ | 1.0 | MnO$_2$ | 0.5 |

TABLE 1-6-continued

| | | | | | | | | | |
|---|---|---|---|---|---|---|---|---|---|
| 110 | 91.2 | 0.62 | 0.78 | YF$_3$ | 6.0 | CaCO$_3$ | 1.0 | MnO$_2$ | 0.5 |
| 111 | 94.2 | 0.60 | 0.98 | Y$_2$O$_3$ | 3.0 | CaCO$_3$ | 1.0 | MnO$_2$ | 0.5 |
| 112 | 94.2 | 0.60 | 0.98 | Y$_2$O$_3$ | 4.0 | — | | MnO$_2$ | 0.5 |
| 113 | 95.2 | 0.60 | 0.98 | Y$_2$O$_3$ | 3.0 | — | | MnO$_2$ | 0.5 |
| 114 | 94.2 | 0.60 | 0.98 | — | | CaCO$_3$ | 4.0 | MnO$_2$ | 0.5 |
| 115 | 94.2 | 0.60 | 0.98 | — | | CaCO$_3$ | 4.0 | MnO$_2$ | 0.5 |
| 116 | 94.2 | 0.60 | 0.98 | Gd$_2$O$_3$ | 3.0 | CaCO$_3$ | 1.0 | MnO$_2$ | 0.5 |
| 117 | 94.2 | 0.62 | 0.78 | La$_2$O$_3$ | 3.0 | CaCO$_3$ | 1.0 | MnO$_2$ | 0.5 |
| 118 | 94.2 | 0.60 | 0.98 | Sm$_2$O$_3$ | 4.0 | — | | MnO$_2$ | 0.5 |
| 119 | 95.2 | 0.60 | 0.98 | Gd$_2$O$_3$ | 3.0 | — | | MnO$_2$ | 0.5 |
| 120 | 94.2 | 0.60 | 0.98 | — | | BaCO$_3$ | 4.0 | MnO$_2$ | 0.5 |

| Ex. No. | Silicon Component (wt %) | | Other Additives (wt %) | | | | | |
|---|---|---|---|---|---|---|---|---|
| 101 | SiO$_2$ | 0.5 | WO$_3$ | 0.3, | B$_2$O$_3$ | 0.2, | Al$_2$O$_3$ | 0.2 |
| 102 | SiO$_2$ | 0.5 | WO$_3$ | 0.3, | B$_2$O$_3$ | 0.2, | Al$_2$O$_3$ | 0.2 |
| 103 | SiO$_2$ | 0.5 | WO$_3$ | 0.3 | | | | |
| 104 | Si$_3$N$_4$ | 0.5 | WO$_3$ | 0.3 | | | | |
| 105 | SiO$_2$ | 0.5 | WO$_3$ | 0.3 | | | | |
| 106 | SiO$_2$ | 0.5 | WO$_3$ | 0.3, | B$_2$O$_3$ | 0.2, | Al$_2$O$_3$ | 0.2 |
| 107 | SiO$_2$ | 0.5 | WO$_3$ | 0.3, | B$_2$O$_3$ | 0.2, | Al$_2$O$_3$ | 0.2 |
| 108 | SiO$_2$ | 0.5 | WO$_3$ | 0.3, | B$_2$O$_3$ | 0.5, | Al$_2$O$_3$ | 0.2 |
| 109 | SiO$_2$ | 0.5 | WO$_3$ | 0.3, | B$_2$O$_3$ | 0.5 | | |
| 110 | Si$_3$N$_4$ | 0.5 | WO$_3$ | 0.3, | B$_2$O$_3$ | 0.5 | | |
| 111 | SiO$_2$ | 0.5 | WO$_3$ | 0.3, | B$_2$O$_3$ | 0.5 | | |
| 112 | SiO$_2$ | 0.5 | WO$_3$ | 0.3, | B$_2$O$_3$ | 0.5 | | |
| 113 | SiO$_2$ | 0.5 | WO$_3$ | 0.3, | B$_2$O$_3$ | 0.5 | | |
| 114 | SiO$_2$ | 0.5 | WO$_3$ | 0.3, | B$_2$O$_3$ | 0.5 | | |
| 115 | SiO$_2$ | 0.5 | WO$_3$ | 0.3, | Al$_2$O$_3$ | 0.5 | | |
| 116 | SiO$_2$ | 0.5 | WO$_3$ | 0.3, | Al$_2$O$_3$ | 0.5 | | |
| 117 | SiO$_2$ | 0.5 | WO$_3$ | 0.3 | Al$_2$O$_3$ | 0.5 | | |
| 118 | SiO$_2$ | 0.5 | WO$_3$ | 0.3 | B$_2$O$_3$ | 0.5 | | |
| 119 | SiO$_2$ | 0.5 | WO$_3$ | 0.3 | Al$_2$O$_3$ | 0.5 | | |
| 120 | SiO$_2$ | 0.5 | WO$_3$ | 0.3, | B$_2$O$_3$ | 0.5 | | |

TABLE 1-7

| | AlN Powder | | | Rare Earth Component (wt %) | | Alkaline Earth Component (wt %) | | Manganese Component (wt %) | | Silicon Component (wt %) | | Other Additives (wt %) | | | |
|---|---|---|---|---|---|---|---|---|---|---|---|---|---|---|---|
| Ex. No. | Amnt. (wt %) | Particle Diam. (μm) | Oxy. Cont. (wt %) | | | | | | | | | | | | |
| 121 | 94.0 | 0.60 | 0.98 | — | | BaCO$_3$ | 4.0 | MnO$_2$ | 0.5 | SiO$_2$ | 0.5 | WO$_3$ | 0.5, | Al$_2$O$_3$ | 0.5 |
| 122 | 92.0 | 0.62 | 0.78 | Y$_2$O$_3$ | 3.0 | CaCO$_3$ | 3.0 | MnO$_2$ | 0.5 | SiO$_2$ | 0.5 | WO$_3$ | 0.5, | Al$_2$O$_3$ | 0.5 |
| 123 | 92.0 | 0.62 | 0.78 | Pr$_6$O$_{11}$ | 3.0 | CaCO$_3$ | 3.0 | MnO$_2$ | 0.5 | SiO$_2$ | 0.5 | WO$_3$ | 0.5, | Al$_2$O$_3$ | 0.5 |
| 124 | 92.0 | 0.62 | 0.78 | Nd$_2$O$_3$ | 3.0 | CaCO$_3$ | 3.0 | MnO$_2$ | 0.5 | SiO$_2$ | 0.5 | WO$_3$ | 0.5, | Al$_2$O$_3$ | 0.5 |

| | AlN Powder | | | Rare Earth Component (wt %) | | Alkaline Earth Component (wt %) | | Manganese Component (wt %) | | Silicon Component (wt %) | | Other Additives (wt %) | |
|---|---|---|---|---|---|---|---|---|---|---|---|---|---|
| Com. Ex. No. | Amnt. (wt %) | Particle Diam. (μm) | Oxy. Cont. (wt %) | | | | | | | | | | |
| 2 | 96.2 | 0.60 | 0.98 | Y$_2$O$_3$ | 3.0 | — | | — | | SiO$_2$ | 0.5 | WO$_3$ | 0.3 |
| 3 | 95.2 | 0.60 | 0.98 | Y$_2$O$_3$ | 3.0 | CaCO$_3$ | 1.0 | — | | SiO$_2$ | 0.5 | WO$_3$ | 0.3 |
| 4 | 95.2 | 0.60 | 0.98 | Y$_2$O$_3$ | 3.0 | CaCO$_3$ | 1.0 | MnO$_2$ | 0.5 | — | | WO$_3$ | 0.3 |

TABLE 2-1

| Example No. | Density (g/cm$^3$) | Thermal Conductivity (W/m · K) | Condition of Surface | Surface Roughness Ra (μ) | Strength (MPa) |
|---|---|---|---|---|---|
| 1 | 3.30 | 150 | A | 0.5 | 300 |
| 2 | 3.29 | 145 | A | 0.7 | 310 |
| 3 | 3.29 | 148 | A | 0.6 | 305 |
| 4 | 3.30 | 143 | A | 0.5 | 304 |
| 5 | 3.30 | 141 | A | 0.4 | 302 |
| 6 | 3.30 | 146 | A | 0.5 | 300 |
| 7 | 3.30 | 144 | A | 0.8 | 310 |
| 8 | 3.29 | 155 | C | 6.0 | 306 |

TABLE 2-1-continued

| Example No. | Density (g/cm³) | Thermal Conductivity (W/m · K) | Condition of Surface | Surface Roughness Ra (μ) | Strength (MPa) |
|---|---|---|---|---|---|
| 9 | 3.30 | 154 | C | 5.0 | 295 |
| 10 | 3.30 | 149 | C | 4.0 | 301 |
| 11 | 3.33 | 151 | C | 4.3 | 306 |
| 12 | 3.36 | 159 | C | 4.9 | 300 |
| 13 | 3.27 | 151 | C | 5.3 | 293 |
| 14 | 3.30 | 156 | C | 5.1 | 300 |
| 15 | 3.30 | 157 | C | 6.1 | 310 |
| 16 | 3.29 | 155 | C | 5.2 | 303 |
| 17 | 3.30 | 149 | C | 4.5 | 302 |
| 18 | 3.29 | 156 | C | 3.9 | 310 |
| 19 | 3.30 | 159 | C | 5.4 | 300 |
| 20 | 3.30 | 161 | A | 0.3 | 308 |
| 21 | 3.29 | 164 | A | 0.7 | 303 |
| 22 | 3.30 | 168 | A | 0.5 | 301 |
| 23 | 3.29 | 169 | A | 0.5 | 302 |
| 24 | 3.30 | 160 | A | 0.6 | 306 |
| 25 | 3.30 | 160 | A | 0.5 | 300 |
| 26 | 3.29 | 165 | A | 0.7 | 310 |
| 27 | 3.29 | 166 | A | 0.6 | 305 |
| 28 | 3.30 | 165 | A | 0.5 | 304 |
| 29 | 3.30 | 163 | A | 0.4 | 302 |
| 30 | 3.30 | 166 | A | 0.5 | 300 |
| 31 | 3.30 | 114 | B | 1.8 | 310 |
| 32 | 3.29 | 112 | B | 1.6 | 306 |
| 33 | 3.30 | 114 | B | 2.0 | 295 |

TABLE 2-2

| Example No. | Density (g/cm³) | Thermal Conductivity (W/m · K) | Condition of Surface | Surface Roughness Ra (μ) | Strength (MPa) |
|---|---|---|---|---|---|
| 34 | 3.30 | 118 | B | 2.4 | 301 |
| 35 | 3.33 | 110 | B | 2.3 | 306 |
| 36 | 3.36 | 111 | B | 1.9 | 300 |
| 37 | 3.27 | 121 | B | 1.3 | 293 |
| 38 | 3.30 | 126 | B | 2.5 | 300 |
| 39 | 3.30 | 127 | B | 1.6 | 310 |
| 40 | 3.29 | 125 | B | 1.5 | 303 |
| 41 | 3.30 | 124 | B | 2.4 | 302 |
| 42 | 3.29 | 126 | B | 2.3 | 310 |
| 43 | 3.30 | 119 | C | 5.5 | 300 |
| 44 | 3.30 | 111 | C | 5.2 | 308 |
| 45 | 3.29 | 111 | C | 5.7 | 303 |
| 46 | 3.30 | 118 | C | 5.5 | 301 |
| 47 | 3.29 | 119 | C | 5.5 | 302 |
| 48 | 3.30 | 110 | C | 4.6 | 306 |
| 49 | 3.30 | 130 | A | 0.5 | 300 |
| 50 | 3.29 | 135 | A | 0.7 | 310 |
| 51 | 3.29 | 136 | A | 0.6 | 305 |
| 52 | 3.30 | 135 | A | 0.5 | 304 |
| 53 | 3.30 | 133 | A | 0.4 | 302 |
| 54 | 3.30 | 136 | A | 0.5 | 300 |
| 55 | 3.30 | 134 | C | 5.8 | 310 |
| 56 | 3.29 | 132 | C | 5.6 | 306 |
| 57 | 3.30 | 134 | C | 4.5 | 295 |
| 58 | 3.30 | 138 | C | 5.4 | 301 |
| 59 | 3.33 | 130 | C | 5.3 | 306 |
| 60 | 3.36 | 131 | C | 5.9 | 300 |
| 61 | 3.27 | 161 | C | 5.3 | 293 |
| 62 | 3.30 | 166 | C | 4.5 | 300 |
| 63 | 3.30 | 167 | C | 5.6 | 310 |
| 64 | 3.29 | 165 | C | 4.5 | 303 |
| 65 | 3.30 | 164 | C | 5.4 | 302 |
| 66 | 3.29 | 166 | C | 4.3 | 310 |

TABLE 2-3

| Example No. | Density (g/cm³) | Thermal Conductivity (W/m·K) | Condition of Surface | Surface Roughness Ra (μ) | Strength (MPa) |
|---|---|---|---|---|---|
| 67 | 3.30 | 139 | A | 0.5 | 300 |
| 68 | 3.30 | 131 | A | 0.3 | 308 |
| 69 | 3.29 | 131 | A | 0.7 | 303 |
| 70 | 3.30 | 138 | A | 0.5 | 301 |
| 71 | 3.29 | 139 | A | 0.5 | 302 |
| 72 | 3.30 | 130 | A | 0.6 | 306 |
| 73 | 3.30 | 130 | A | 0.5 | 300 |
| 74 | 3.29 | 136 | A | 0.6 | 305 |
| 75 | 3.30 | 135 | A | 0.5 | 304 |
| 76 | 3.30 | 133 | A | 0.4 | 302 |
| 77 | 3.30 | 136 | A | 0.5 | 300 |
| 78 | 3.30 | 134 | A | 0.8 | 310 |
| 79 | 3.29 | 102 | C | 5.6 | 306 |
| 80 | 3.30 | 104 | C | 4.5 | 295 |
| 81 | 3.30 | 108 | C | 5.4 | 301 |
| 82 | 3.33 | 100 | C | 5.3 | 306 |
| 83 | 3.36 | 101 | C | 4.9 | 300 |
| 84 | 3.27 | 101 | C | 5.3 | 293 |
| 85 | 3.39 | 116 | C | 5.5 | 300 |
| 86 | 3.30 | 117 | C | 5.6 | 310 |
| 87 | 3.29 | 115 | C | 6.5 | 303 |
| 88 | 3.30 | 114 | C | 5.4 | 302 |
| 89 | 3.29 | 116 | C | 5.3 | 310 |
| 90 | 3.30 | 119 | C | 4.5 | 300 |
| 91 | 3.30 | 111 | B | 2.3 | 308 |
| 92 | 3.29 | 111 | B | 2.7 | 303 |
| 93 | 3.30 | 118 | B | 2.5 | 301 |
| 94 | 3.29 | 119 | B | 2.5 | 302 |
| 95 | 3.30 | 110 | B | 2.6 | 306 |
| 96 | 3.29 | 116 | B | 2.3 | 310 |
| 97 | 3.30 | 139 | A | 0.5 | 300 |
| 98 | 3.30 | 131 | A | 0.3 | 308 |
| 99 | 3.29 | 131 | A | 0.7 | 303 |

TABLE 2-4

| Example No. | Density (g/cm³) | Thermal Conductivity (W/m·K) | Condition of Surface | Surface Roughness Ra (μ) | Strength (MPa) |
|---|---|---|---|---|---|
| 100 | 3.30 | 128 | A | 0.5 | 301 |
| 101 | 3.29 | 126 | A | 0.3 | 310 |
| 102 | 3.30 | 129 | A | 0.5 | 300 |
| 103 | 3.30 | 141 | A | 0.3 | 308 |
| 104 | 3.29 | 141 | A | 0.7 | 303 |
| 105 | 3.30 | 143 | A | 0.5 | 300 |
| 106 | 3.30 | 151 | A | 0.3 | 308 |
| 107 | 3.30 | 148 | A | 0.5 | 301 |
| 108 | 3.29 | 111 | B | 2.7 | 303 |
| 109 | 3.30 | 118 | B | 2.5 | 301 |
| 110 | 3.29 | 119 | B | 2.5 | 302 |
| 111 | 3.30 | 110 | B | 2.6 | 306 |
| 112 | 3.29 | 116 | B | 2.3 | 310 |
| 113 | 3.30 | 139 | A | 0.5 | 300 |
| 114 | 3.30 | 131 | A | 0.3 | 308 |
| 115 | 3.29 | 131 | A | 0.7 | 303 |
| 116 | 3.30 | 128 | A | 0.5 | 301 |
| 117 | 3.29 | 126 | A | 0.3 | 310 |
| 118 | 3.30 | 129 | A | 0.5 | 300 |
| 119 | 3.30 | 141 | A | 0.3 | 308 |
| 120 | 3.29 | 141 | A | 0.7 | 303 |
| 121 | 3.30 | 143 | A | 0.5 | 300 |
| 122 | 3.30 | 151 | A | 0.3 | 308 |
| 123 | 3.30 | 148 | A | 0.5 | 301 |
| 124 | 3.30 | 150 | A | 0.5 | 308 |

| Comp. Example No. | Density (g/cm³) | Thermal Conductivity (W/m·K) | Condition of Surface | Surface Roughness Ra (μ) | Strength (MPa) |
|---|---|---|---|---|---|
| 2 | 3.20 | 131 | A | 0.8 | 170 |
| 3 | 3.23 | 139 | A | 0.8 | 190 |
| 4 | 3.31 | 152 | B | 1.3 | 250 |

Example 125

Prepared was a mixture of 94.7% by weight of AlN powder (containing 0.98% by weight of oxygen impurities) of an average primary particle diameter of 0.6 μm; 3.0% by weight of $Y_2O_3$ (purity: 99.9% by weight) of an average particle diameter of 0.1 μm; 1.0% by weight of $CaCO_3$ (purity: 99.9% by weight) of an average particle diameter of 0.5 μm [corresponding to 0.56% by weight as calcium oxide]; 0.5% by weight of $MnO_2$ (purity: 99.9% by weight) of an average particle diameter of 0.2 μm; 0.5 by weight of $SiO_2$ (purity: 99.9% by weight) of an average particle diameter of 0.1 μm; and 0.3% by weight of $WO_3$ (purity: 99.9% by weight) of an average particle diameter of 0.1 μm [corresponding to 0.24% by weight as a simple tungsten] as a colorant.

This mixed powder and an acrylic binder were dispersed in an alcoholic solvent to prepare a slurry of a viscosity of 5,000 CPS. The resulting slurry was formed into sheets according to the doctor blade method and a plurality of uniform green sheets having a thickness of about 0.3 mm was formed. The green sheets were cut into specified dimensions. Next, a plurality of via holes for joining the layers were formed in specified positions in these green sheets.

Next, a tungsten paste prepared from a tungsten powder of an average particle dimension of 0.8 μm was pressed into the via holes in the green sheets and specified patterns for a conductive circuit were formed with the tungsten paste by screen printing the surfaces. Then, the green sheets formed with the conductive circuit of the tungsten paste were laminated so that the positions of the via holes conformed, and hot pressing was implemented. Next, the resulting laminated body was shaped and heated up to 700° C. in a nitrogen atmosphere to eliminate the binder. The binder-less laminated body was set in a sintering setter made of an AlN sintered material and placed in a furnace with a graphite heater in an atmosphere of nitrogen gas, then sintered for three hours at 1,600° C. to produce a circuit substrate of a sintered aluminum nitride.

The circuit substrate had a smooth surface which exhibited no warping, undulation, cracks, or swelling. When the shape of the circuit substrate was observed by an SEM, the aluminum nitride layer and the tungsten layer were judged to be sufficiently dense.

Example 126

Three green sheets having the same composition as for the 109th example were formed in the similar procedures used in the 125th example. The green sheets were then laminated, and hot pressing was implemented. Next, the laminated body was heated up to 700° C. to remove the binder. The binder-less laminated body was set in a sintering setter made of an AlN sintered material and placed in a furnace with a carbon heater in an atmosphere of nitrogen gas, then sintered for three hours at 1,600° C. to produce a sintered aluminum nitride body. The obtained aluminum nitride body was shaped into a plate having a dimension of 35 mm×35 mm×0.7 mm. This plate was heated for three hours at a temperature of 1,130° C. in an air so as to produce a layer of $\alpha$-$Al_2O_3$ on the surface of the plate at a thickness of about 1 μm. Following to this, one of the opposite surfaces (35 mm×35 mm) of the plate was contacted with a copper plate containing 400 ppm of oxgen and heated to 1,070° C. for three minutes in a nitrogen gas containing 7 ppm of oxygen gas so taht the sintered aluminum nitride plate and the cupper plate were bonded to produce a circuit substrate.

When the bonding surface of the obtained circuit substrate was observed, the aluminum nitride plate and the copper plate were firmly bonded. Moreover, peel strength of the circuit substrate was measured at 11 kgf/cm.

Example 127

Prepared was a mixture of 94.7% by weight of AlN powder (containing 0.98% by weight of oxygen impurities) of an average primary particle diameter of 0.6 μm; 3.0% by weight of $Y_2O_3$ (purity: 99.9% by weight) of an average particle diameter of 0.1 μm; 1.0% by weight of $CaCO_3$ (purity: 99.9% by weight) of an average particle diameter of 0.5 μm [corresponding to 0.56% by weight as calcium oxide]; 0.5% by weight of $MnO_2$ (purity: 99.9% by weight) of an average particle diameter of 0.2 μm; 0.5 by weight of $SiO_2$ (purity: 99.9% by weight) of an average particle diameter of 0.1 μm; and 0.3% by weight of $WO_3$ (purity: 99.9% by weight) of an average particle diameter of 0.1 μm [corresponding to 0.24% by weight as a simple tungsten] as a colorant.

This mixed powder and an acrylic binder were dispersed in an alcoholic solvent to prepare a slurry of a viscosity of 5,000 CPS. The resulting slurry was formed into sheets according to the doctor blade method and a plurality of uniform green sheets having a thickness of about 0.3 mm was formed. The green sheets were cut into specified dimensions. Next, a plurality of via holes for joining the layers were formed in specified positions in these green sheets.

In an organic solvent with an organic binder dispersed were 85% by volume of a W powder of an average particle diameter of 0.8 μm and 15% by volume of a mixed powder made up of 94.7% by weight of AlN powder of an average primary particle diameter of 0.6 μm, 3.0% by weight of $Y_2O_3$, 1.0% by weight of $CaCO_3$, 0.5% by weight of $MnO_2$; 0.5 by weight of $SiO_2$, and 0.3% by weight of $WO_3$, to prepare a conductive paste. The conductive paste was pressed into the via holes in the green sheets and specified patterns for a conductive circuit were formed with the conductive paste by screen printing the surfaces. Then, the green sheets formed with the conductive circuit of the tungsten mixture were laminated so that the positions of the via holes conformed, and hot pressing was implemented. Next, the resulting laminated body was shaped and heated up to 700° C. in a nitrogen atmosphere to eliminate the binder. The binder-less laminated body was set in a sintering setter made of an AlN sintered material and placed in a furnace with a graphite heater in an atmosphere of nitrogen gas, then sintered for three hours at 1,600° C. to produce a circuit substrate of a sintered aluminum nitride.

The circuit substrate had a smooth surface which exhibited no warping, undulation, cracks, or swelling. When the shape of the circuit substrate was observed by an SEM, the aluminum nitride layer and the conductive circuit was judged to be sufficiently dense. The resistance of the conductive circuit of the circuit substrate were examined at $1.1 \times 10^{-5}$ Ω.

Example 128

Prepared was a mixture of 94.7% by weight of AlN powder (containing 0.98% by weight of oxygen impurities) of an average primary particle diameter of 0.6 μm; 3.0% by weight of $Y_2O_3$ (purity: 99.9% by weight) of an average particle diameter of 0.1 μm; 1.0% by weight of $CaCO_3$ (purity: 99.9% by weight) of an average particle diameter of 0.5 μm [corresponding to 0.56% by weight as calcium oxide]; 0.5% by weight of $MnO_2$ (purity: 99.9% by weight) of an average particle diameter of 0.2 μm; 0.5 by weight of $SiO_2$ (purity: 99.9% by weight) of an average particle diameter of 0.1 µm; and 0.3% by weight of $WO_3$ (purity: 99.9% by weight) of an average particle diameter of 0.1 µm [corresponding to 0.24% by weight as a simple tungsten] as a colorant.

This mixed powder and an acrylic binder were dispersed in an alcoholic solvent to prepare a slurry of a viscosity of 5,000 CPS. The resulting slurry was formed into sheets according to the doctor blade method and a plurality of uniform green sheets having a thickness of about 0.3 mm was formed. The green sheets were cut into specified dimensions. Next, a plurality of via holes for joining the layers were formed in specified positions in these green sheets.

In an organic solvent with an organic binder dispersed were 99% by volume of a W powder of an average particle diameter of 0.8 µm and 1% by volume of a mixed powder made up of 56.6% by weight of $Y_2O_3$, 18.9% by weight of $CaCO_3$, 9.4% by weight of $MnO_2$; 9.4 by weight of $SiO_2$, and 5.7% by weight of $WO_3$, to prepare a conductive paste. The conductive paste was pressed into the via holes in the green sheets and specified patterns for a conductive circuit were formed with the conductive paste by screen printing the surfaces. Then, the green sheets formed with the conductive circuit of the tungsten mixture were laminated so that the positions of the via holes conformed, and hot pressing was implemented. Next, the resulting laminated body was shaped and heated up to 700° C. in a nitrogen atmosphere to eliminate the binder. The binder-less laminated body was set in a sintering setter made of an AlN sintered material and placed in a furnace with a graphite heater in an atmosphere of nitrogen gas, then sintered for three hours at 1,600° C. to produce a circuit substrate of a sintered aluminum nitride.

The circuit substrate had a smooth surface which exhibited no warping, undulation, cracks, or swelling. When the shape of the circuit substrate was observed by an SEM, the aluminum nitride layer and the conductive circuit was judged to be sufficiently dense. The resistance of the conductive circuit of the circuit substrate were examined at $1.3 \times 10^{-5}$ Ω.

As described above, the sintered aluminum nitride material according to the present invention has excellent thermal conductivity of 120 W/m·K or more, and has a smooth surface which exhibited no sintering irregulation, color irregulation, warping or undulation, in spite of a low sintering temperature of about 1,600° C. Therefore, products using the sintered aluminum nitride of the present invention can be manufactured at high yields, and machining of the products can be easily carried out because of smooth surfaces of the sitnered aluminum nitride product.

As mentioned above, it must be understood that the invention is in no way limited to the above embodiments and that many changes may be brought about therein without departing from the scope of the invention as defined by the appended claims.

What is claimed is:

1. A sintered aluminum nitride composition, comprising:
    aluminum nitride being contained in the sintered aluminum nitride composition at an amount of 84.8% by weight or more;
    a first component given by a compound containing an element which is selected from the group consisting of alkaline earth elements and group IIIa elements of the periodic table, and being contained in the sintered aluminum nitride composition at an amount such that, assuming that the first component is converted to a corresponding oxide, the amount of said corresponding oxide is within a range of 0.01 to 10% by weight relative to the amount of the sintered aluminum nitride composition;
    a second component made of either a simple silicon or a silicon-containing compound, and being contained in the sintered aluminum nitride composition at an amount such that the amount of the silicon element is within a range of 0.001 to 10% by weight relative to the amount of the sintered aluminum nitride composition; and
    a third component made of either a simple manganese or a manganese-containing compound, being contained in the sintered aluminum nitride composition at an amount such that the amount of the manganese element is within a range of 0.001 to 10% by weight relative to the amount of the sintered aluminum nitride composition.

2. The sintered aluminum nitride composition of claim 1, wherein said element of the first component is selected from scandium, yttrium, lanthanide elements, beryllium, magnesium, calcium, strontium and barium.

3. The sintered aluminum nitride composition of claim 1, wherein said compound giving the first component is either oxide, carbide, nitride, boride or borate.

4. The sintered aluminum nitride composition of claim 1, wherein the first component is contained in the sintered aluminum nitride composition at an amount such that, assuming that said first component is converted to a corresponding oxide, the amount of said corresponding oxide is within a range of 0.01 to 10% by weight relative to the amount of the sintered aluminum nitride composition.

5. The sintered aluminum nitride composition of claim 1, wherein the first component is contained in the sintered aluminum nitride composition at an amount such that, assuming that said first component is converted to a corresponding oxide, the amount of said corresponding oxide is within a range of 0.01 to 5% by weight relative to the amount of the sintered aluminum nitride composition.

6. The sintered aluminum nitride composition of claim 1, wherein said silicon-containing compound of the second component is selected from silica, orthosilicate, metasilicate, silicon carbide, silicon nitride, boron silicide or a metal silicide.

7. The sintered aluminum nitride composition of claim 1, wherein said manganese-containing compound of the third component is selected from manganese monoxide, manganese dioxide, potassium permanganate, manganese carbide, manganese nitride, manganese boride and manganate.

8. A sintered aluminum nitride composition, comprising:
    a matrix phase comprising particulate aluminum nitride and being contained in the sintered aluminum nitride composition at an amount of 84.8% by weight or more; and
    a boundary phase interposing in the matrix phase, the boundary phase comprising:
        a compound containing an element which is selected from the group consisting of alkaline earth elements and group IIIa elements of the periodic table, being contained in the sintered aluminum nitride composition at an amount such that, assuming that said compound is converted to a corresponding oxide, the amount of said corresponding oxide is within a range of 0.01 to 10% by weight relative to the amount of the sintered aluminum nitride composition;
        a simple silicon or a silicon-containing compound, being contained in the sintered aluminum nitride composition at an amount such that the amount of the silicon element is within a range of 0.001 to 10% by weight relative to the sintered aluminum nitride composition; and a simple manganese or a manganese-containing compound, being contained in the sintered aluminum nitride composition at an amount such that the amount of the manganese element is within a range of 0.001 to 10% by weight relative to the amount of the sintered aluminum nitride composition.

9. A circuit substrate comprising:

an insulating layer; and an electrically conductive layer for making an electrical connection in the circuit substrate, wherein the insulating layer comprises a sintered aluminum nitride composition which comprises:

aluminum nitride being contained in the sintered aluminum nitride composition at an amount of 84.8% by weight or more, a first component given by a compound containing an element which is selected from the group consisting of alkaline earth elements and group IIIa elements of the periodic table, the first component being contained in the sintered aluminum nitride composition at an amount such that, assuming that the first component is converted to a corresponding oxide, the amount of said corresponding oxide is within a range of 0.01 to 10% by weight relative to the amount of the sintered aluminum nitride composition, a second component made of either a simple silicon or a silicon-containing compound, the second component being contained in the sintered aluminum nitride composition at an amount such that the amount of the silicon element is within a range of 0.001 to 10% by weight relative to the amount of the sintered aluminum nitride composition, and a third component made of either a simple manganese or a manganese-containing compound, the third component being contained in the sintered aluminum nitride composition at an amount such that the amount of the manganese element is within a range of 0.001 to 10% by weight relative to the amount of the sintered aluminum nitride composition, and wherein the electrically conductive layer comprises:

a conductive component which is a metal or an electrically conductive compound for exhibiting electric conductivity, said first component, said second component, and said third component.

10. The circuit substrate of claim 9, wherein the electrically conductive layer further comprises an aluminum nitride component.

11. The circuit substrate of claim 9, wherein the conductive component is selected from the group consisting of tungsten, tungsten boride, tungsten carbide, molybdenum, molybdenum boride and molybdenum carbide.

12. The circuit substrate of claim 9, wherein said element of the first component is at least one selected from scandium, yttrium, lanthanide elements, beryllium, magnesium, calcium, strontium and barium.

13. The circuit substrate of claim 9, wherein said compound giving the first component is either oxide, carbide, nitride, boride or borate.

14. The circuit substrate of claim 9, wherein the first component of the electrically conductive layer includes a compound formed by an aluminum element, an oxygen element and at least one element selected from the group consisting of alkaline earth elements and group IIIa elements of the periodic table.

15. The circuit substrate of claim 9, wherein said silicon-containing compound of the second component is selected from silica, orthosilicate, metasilicate, silicon carbide, silicon nitride, boron silicide and metal silicide.

16. The circuit substrate of claim 9, wherein said manganese-containing compound of the third component is one selected from manganese monoxide, manganese dioxide, potassium permanganate, manganese carbide, manganese nitride, manganese boride and manganate.

17. The sintered aluminum nitride composition of claim 1, wherein the first component is contained in the sintered aluminum nitride composition at an amount such that, assuming that the first component is converted to a corresponding oxide, the amount of said corresponding oxide is within a range of 0.01 to 5% by weight relative to the amount of the sintered aluminum nitride composition.

18. The sintered aluminum nitride composition of claim 8, wherein said compound is contained in the sintered aluminum nitride composition at an amount such that, assuming that said compound is converted to a corresponding oxide, the amount of said corresponding oxide is within a range of 0.01 to 5% by weight relative to the amount of the sintered aluminum nitride composition.

19. The sintered aluminum nitride composition of claim 1, wherein the second component is contained in the sintered aluminum nitride composition at an amount such that the amount of the silicon element is within a range of 0.001 to 5% by weight relative to the amount of the sintered aluminum nitride composition.

20. The sintered aluminum nitride composition of claim 1, wherein the second component is contained in the sintered aluminum nitride composition at an amount such that the amount of the silicon element is within a range of 0.001 to 1% by weight relative to the amount of the sintered aluminum nitride composition.

21. The sintered aluminum nitride composition of claim 8, wherein the simple silicon or the silicon-containing compound is contained in the sintered aluminum nitride composition at an amount such that the amount of the silicon element is within a range of 0.001 to 5% by weight relative to the amount of the sintered aluminum nitride composition.

22. The sintered aluminum nitride composition of claim 8, wherein the simple silicon or the silicon-containing compound is contained in the sintered aluminum nitride composition at an amount such that the amount of the silicon element is within a range of 0.001 to 1% by weight relative to the amount of the sintered aluminum nitride composition.

23. The sintered aluminum nitride composition of claim 1, wherein the third component is contained in the sintered aluminum nitride composition at an amount such that the amount of the manganese element is within a range of 0.001 to 5% by weight relative to the amount of the sintered aluminum nitride composition.

24. The sintered aluminum nitride composition of claim 1, wherein the third component is contained in the sintered aluminum nitride composition at an amount such that the amount of the manganese element is within a range of 0.001 to 1% by weight relative to the amount of the sintered aluminum nitride composition.

25. The sintered aluminum nitride composition of claim 8, wherein the simple manganese or the manganese-containing compound is contained in the sintered aluminum nitride composition at an amount such that the amount of the manganese element is within a range of 0.001 to 5% by weight relative to the amount of the sintered aluminum nitride composition.

26. The sintered aluminum nitride composition of claim 8, wherein the simple manganese or the manganese-containing compound is contained in the sintered aluminum nitride composition at an amount such that the amount of the manganese element is within a range of 0.001 to 1% by weight relative to the amount of the sintered aluminum nitride composition.

* * * * *